(12) United States Patent
Koga et al.

(10) Patent No.: US 7,266,759 B2
(45) Date of Patent: Sep. 4, 2007

(54) SEMICONDUCTOR INTEGRATED CIRCUIT DEVICE AND ERROR CHECKING AND CORRECTING METHOD THEREOF

(75) Inventors: Mitsuhiro Koga, Yokohama (JP); Hiroshi Shinya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 422 days.

(21) Appl. No.: 10/878,229

(22) Filed: Jun. 29, 2004

(65) Prior Publication Data
US 2005/0005230 A1 Jan. 6, 2005

(30) Foreign Application Priority Data
Jun. 30, 2003 (JP) .............................. 2003-188710

(51) Int. Cl.
*G11C 29/00* (2006.01)
(52) U.S. Cl. ...................................... 714/805; 714/762
(58) Field of Classification Search ................. 714/762
See application file for complete search history.

(56) References Cited

U.S. PATENT DOCUMENTS 5,127,014 A * 6/1992 Raynham .................... 714/754
6,065,146 A * 5/2000 Bosshart ..................... 714/754
6,216,246 B1 * 4/2001 Shau .......................... 714/763
7,117,421 B1 * 10/2006 Danilak ....................... 714/763
2002/0184592 A1 12/2002 Koga et al.

FOREIGN PATENT DOCUMENTS

| JP | 10-177800 | 6/1998 |
|---|---|---|
| JP | 2003-59290 | 2/2003 |

* cited by examiner

*Primary Examiner*—Guy Lamarre
*Assistant Examiner*—Sam Rizk
(74) *Attorney, Agent, or Firm*—Finnegan, Henderson, Farabow, Garrett & Dunner, L.L.P.

(57) ABSTRACT

A semiconductor integrated circuit device includes a memory cell array, an error checking and correcting (ECC) circuit which performs an error checking and correcting operation for readout data read out from the normal data storing portion at data readout time during read latency and an I/O buffer. The memory cell array includes a normal data storing portion and a parity data storing portion. The normal data storing portion stores data for use in a normal data write and a normal data read. The parity data storing portion stores parity data for use in error checking and correcting. The EEC circuit carries out error checking and correcting read data read out from the normal data storing portion, during read latency cycle at a data read operation. The I/O buffer outputs the read data error checked and corrected by the ECC circuit, after the read latency cycle has lapsed.

2 Claims, 15 Drawing Sheets

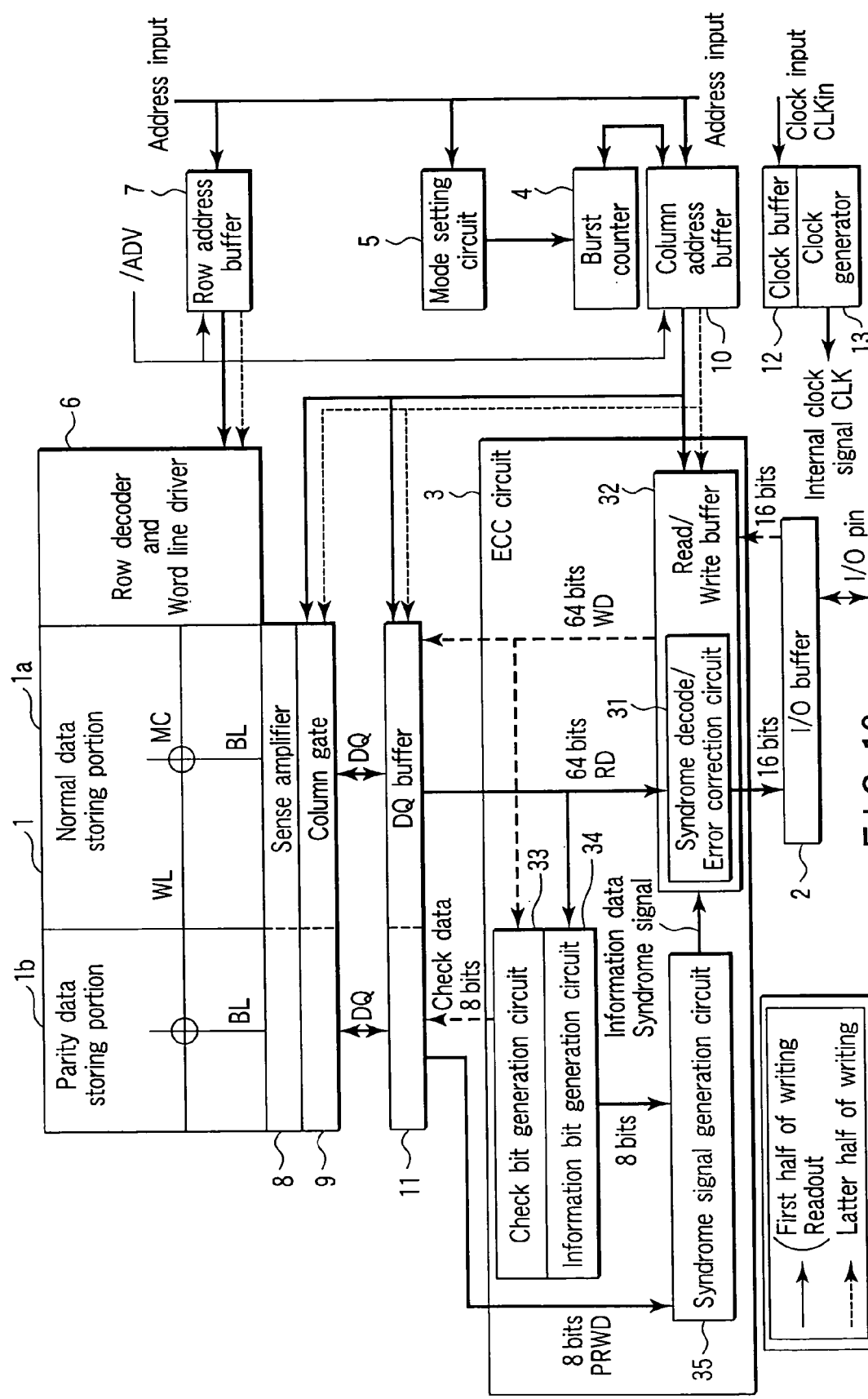
F I G. 19

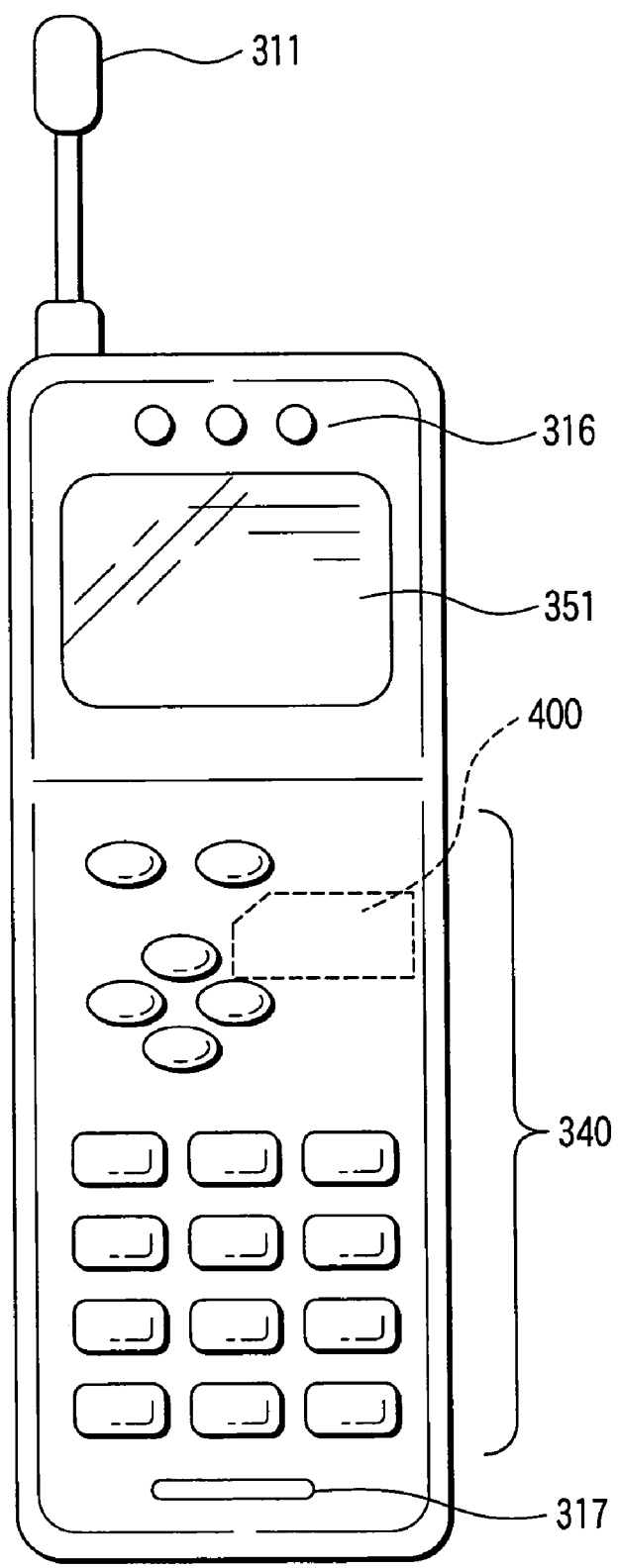
F I G. 25

SEMICONDUCTOR INTEGRATED CIRCUIT DEVICE AND ERROR CHECKING AND CORRECTING METHOD THEREOF

CROSS-REFERENCE TO RELATED APPLICATIONS

This application is based upon and claims the benefit of priority from the prior Japanese Patent Application No. 2003-188710, filed Jun. 30, 2003, the entire contents of which are incorporated herein by reference.

BACKGROUND OF THE INVENTION

1. Field of the Invention

This invention relates to a semiconductor integrated circuit device and more particularly to a semiconductor integrated circuit device having an error checking and correcting (ECC) circuit, and an error checking and correcting method thereof.

2. Description of the Related Art

With miniaturization, an increase in the capacity and a reduction in the power consumption of semiconductor memory devices, particularly, it becomes more difficult for a memory cell having a fine structure in the semiconductor memory device to attain a high reliability in the process and transistor characteristics. Since an SRAM among the semiconductor memories has memory cells each formed of a plurality of transistors (six transistors in a full CMOS type cell), it is difficult to form a cell with a small size and large capacity. On the other hand, since a memory cell of a DRAM is configured by one transistor and one capacitor, it is suitable for miniaturization and large capacity.

For example, it is considered that part of a memory system configured by use of SRAMs is replaced by a pseudo-SRAM (PSRAM) using DRAM cells to attain miniaturization in a small-sized portable electronic equipment by taking the feature of the DRAM into consideration. Generally, the row and column addresses are multiplexed in the DRAM and the addresses are not multiplexed in the SRAM. Therefore, if an interface for the SRAM is used as it is, the PSRAM is used without multiplexing the addresses. Further, since the DRAM requires the data refresh operation, it becomes necessary to incorporate an auto refresh circuit in an internal portion of the PSRAM.

Since the PSRAM utilizes DRAM cells, it is suitable for formation of a memory system of small size and large capacity. However, since it is necessary to periodically refresh data, the power consumption tends to become larger. Therefore, in the PSRAM, for example, an attempt is made to meet the requirement of power saving by setting the operation voltage as low as possible or setting the refresh cycle as long as possible.

However, as the power consumption is reduced more, it becomes more difficult to maintain the data holding characteristic of the DRAM cell, and it is therefore required to take a measure to prevent deterioration of the data holding characteristic. The deterioration of the data holding characteristic caused by power saving is not peculiar to the PSRAM and similarly occurs in a normal DRAM and a nonvolatile semiconductor device such as an EEPROM.

As a device which solves a problem of deterioration of the data holding characteristic, there is provided a semiconductor memory device having an error checking and correcting (ECC) circuit.

As a known reference of the semiconductor memory device having the ECC circuit, for example, documents 1, 2 exist.

Document 1: Jpn. Pat. Appln. KOKAI Publication No. 10-177800

Document 2: Jpn. Pat. Appln. KOKAI Publication No. 2003-59290

The semiconductor memory device having the ECC circuit can solve a problem of deterioration of the data holding characteristic caused by power saving. However, since a series of operations for ECC is additionally provided in addition to the normal read operation and write operation, the access speed is lowered.

Semiconductor memory devices, for example, PSRAMs which are frequently used in small-sized portable electronic equipments are required to attain a large power saving and enhance the access speed.

BRIEF SUMMARY OF THE INVENTION

A semiconductor integrated circuit device according to a first aspect of the present invention comprises: a semiconductor integrated circuit device comprising: a memory cell array having a normal data storing portion which stores data used for normal data writing and normal data readout operations and a parity data storing portion which stores parity data used for an error checking and correcting operation for readout data read out from the normal data storing portion; an error checking and correcting circuit which performs an error checking and correcting operation for readout data read out from the normal data storing portion at data readout time during read latency; and an I/O buffer which outputs readout data subjected to the error checking and correcting operation by the error checking and correcting circuit after elapse of the read latency.

An error checking and correcting method for a semiconductor integrated circuit device according to a second aspect of the present invention comprises: an error checking and correcting method for a semiconductor integrated circuit device having a memory cell array which includes a normal data storing portion and a parity data storing portion, the error checking and correcting method comprising: performing an error checking and correcting operation for readout data read out from the normal data storing portion at burst data readout time based on parity data read out from the parity data storing portion during read latency; and sequentially outputting data subjected to the error checking and correcting operation after elapse of the read latency, performing an error checking and correcting operation for readout data read out from the normal data storing portion at burst data write time based on parity data read out from the parity data storing portion during the read latency; and sequentially rewriting data subjected to the error checking and correcting operation according to input write data after elapse of the read latency.

BRIEF DESCRIPTION OF THE SEVERAL VIEWS OF THE DRAWING

FIG. 19 is a block diagram showing an example of the configuration of a synchronous semiconductor memory device with an ECC circuit according to a second embodiment of this invention;

FIG. 25 is a plan view showing the appearance of a portable telephone terminal.

DETAILED DESCRIPTION OF THE INVENTION

There will now be described embodiments of this invention with reference to the accompanying drawings. In the explanation, portions which are common throughout the drawings are denoted by the same reference symbols.

FIRST EMBODIMENT

Figure 1:
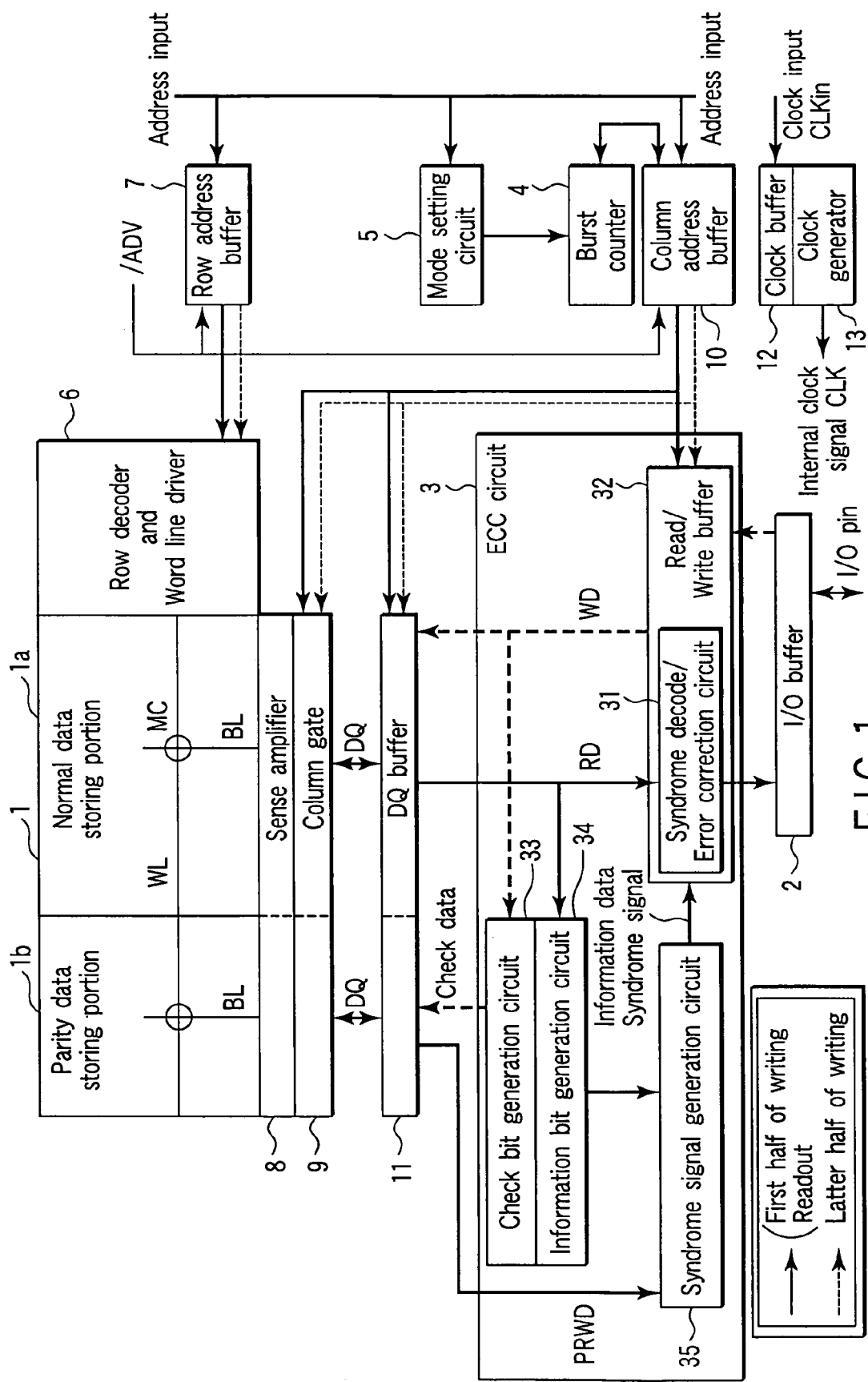
FIG. 1 is a block diagram showing an example of the configuration of a synchronous semiconductor memory device according to a first embodiment of this invention.

FIG. 1 is a block diagram showing an example of the configuration of a synchronous semiconductor memory device according to a first embodiment of this invention.

As shown in FIG. 1, the device according to the first embodiment is a pseudo SRAM (PSRAM) using DRAM cells as memory cells MC. In the device according to the first embodiment, an error checking and correcting (ECC) circuit 3 is provided between a memory cell array 1 and an I/O buffer 2. The memory cell array 1 includes a normal data storing portion 1a and a parity data storing portion 1b. The ECC circuit 3 performs a single-error-correction operation by using a hamming-code as an error correction code, for example.

The device according to the first embodiment has a burst counter 4. The burst counter 4 is used in the burst mode and generates an internal address (corresponding to a column address) of burst length (B.L.) set in a mode setting circuit 5 in the burst mode. That is, the device according to the first embodiment is a PSRAM with burst mode. The device is explained in detail below.

As shown in FIG. 1, the normal data storing portion 1a is used for the normal data write/read operation and normal data is stored into the memory cells MC in the normal data storing portion 1a. The parity data storing portion 1b is used for the error checking and correcting (ECC) operation and check data for ECC, for example, parity data for determination of an odd or even number of syndromes is stored in the memory cells MC in the parity data storing portion 1b.

Word lines WL and bit lines BL are provided in the memory cell array 1. The word lines WL are continuously formed to extend from the normal data storing portion 1a to the parity data storing portion 1b and the memory cells MC are provided at the intersections between the word lines WL and the bit lines BL.

A row decoder and word line driver 6 selectively drives the word line WL based on an input address (corresponding to a row address). For example, the address is input to a row address buffer 7 from the exterior according to an address valid signal /ADV and then input to the row decoder via the row address buffer 7. The row decoder decodes an input internal address and selects a word line driver based on the decode result. The selected word line driver drives a word line connected thereto.

The bit lines BL are connected to a column gate 9 via a sense amplifier 8. The column gate 9 selects one of the bit lines BL based on the internal address output from a column address buffer 10 and connects the selected bit line BL to a corresponding one of data lines DQ. As a result, data is transferred between the bit line BL and the data line DQ.

The data line DQ is connected to a DQ buffer 11. The ECC circuit 3 is provided between the DQ buffer 11 and the I/O buffer 2.

The ECC circuit 3 includes a read/write buffer 32 having a syndrome decode/error correction circuit 31, check bit generation circuit 33, information bit generation circuit 34 and syndrome generation circuit 35. The check bit generation circuit 33 generates check data to be written into the parity data storing portion 1*b* based on write data (WD) input from the exterior via an I/O pin, for example. The information bit generation circuit 34 extracts information data from readout data RD read out from the normal data storing portion 1*a*. The syndrome generation circuit 35 compares check data PRWD read out from the parity data storing portion 1*b* with information data to generate a syndrome signal. The syndrome decode/error correction circuit 31 decodes the syndrome signal and detects the presence or absence of an error for each bit, for example. If an error is generated, it inverts and corrects the bit data containing the error. For the error checking and correcting operation, a known method can be used. In this example, it is assumed that a single-error-correction operation using a hamming-code is used as the error checking and correcting operation. One example of the concrete error checking and correcting operation is described in the document 2, and therefore, the detail explanation thereof is omitted in this specification. Briefly, the presence or absence of an error is checked according to whether the logical value of addresses in hamming-code checking rows and columns is "0" or "1", for example. For example, the logic value becomes "1" in an address in which an error occurs and the logic value becomes "0" in an address containing no error. The syndrome decode/error correction circuit 31 inverts bit data corresponding to the address whose logic value becomes "1" and corrects the 1-bit error.

The burst mode is set based on set information associated with the burst mode, for example, read latency (R.L.), burst length, linear sequence, interleave sequence or the like. For example, the above set information items are previously set in the mode setting circuit 5 by use of an input address. In the burst mode, for example, the device is operated based on an internal clock CLK which is created based on an externally input clock input CLKin and generated via a clock buffer 12 and clock generator 13. The internal clock CLK is supplied to the burst counter 4, row decoder 3 and the like.

Next, the operation of the device according to the first embodiment is explained. It is assumed that the operation described below corresponds to the burst data read and write operations.

(Read Operation)

Figure 11:
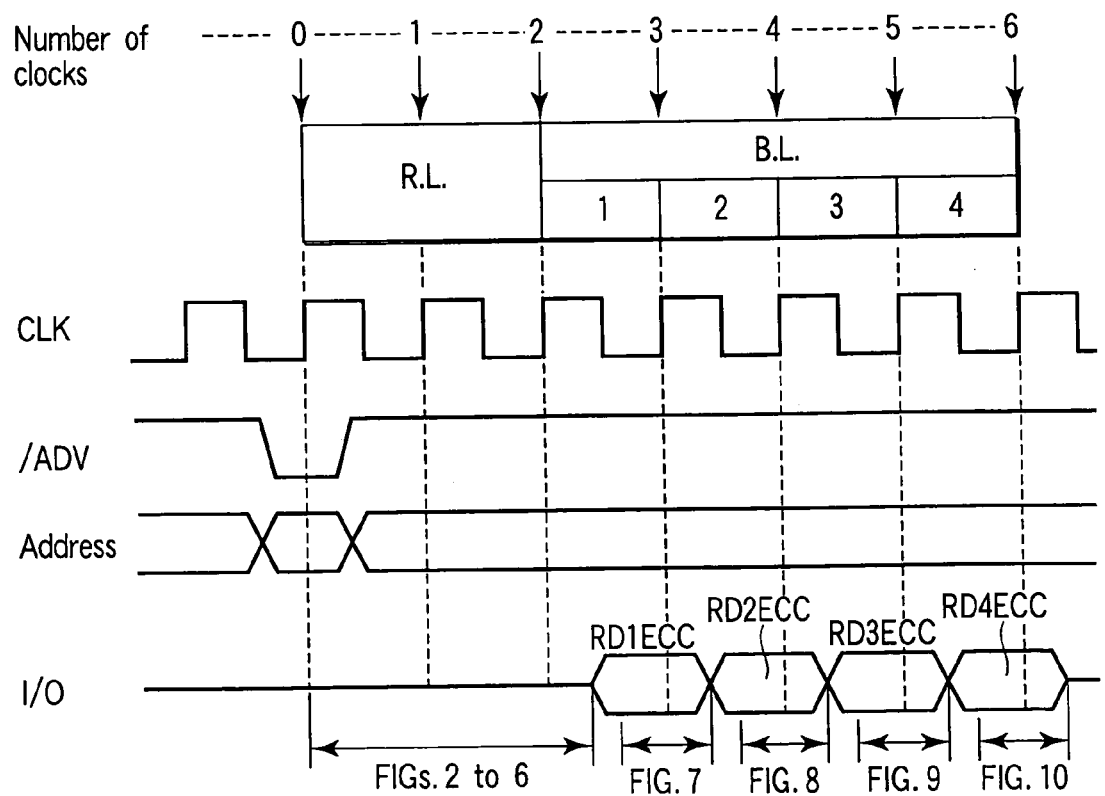
FIG. 11 is an operation waveform diagram showing an example of the readout operation of the synchronous semiconductor memory device according to the first embodiment of this invention.

In the first embodiment, the ECC operation for data read out in the read operation is terminated during the set read latency. For example, when the read latency is set to "two clocks", the following operations (1) to (5) are terminated within a period of "two clocks" after the address valid signal/ADV is transited to the "LOW" level. Then, a state is set up so that the first burst data outputting operation can be performed at the "second clock" time. FIGS. 2 to 10 show one example of the operation which is visualized and FIG. 11 shows an operation waveform diagram of the operation.

In one example of the operation, it is assumed that the read latency is set to "two clocks", the burst length is set to "four words" and the "four word" parallel read/"one word" serial output operation is performed. Of course, the read latency and burst length are not limited to "two clocks" and "four words", respectively.

Figure 2:
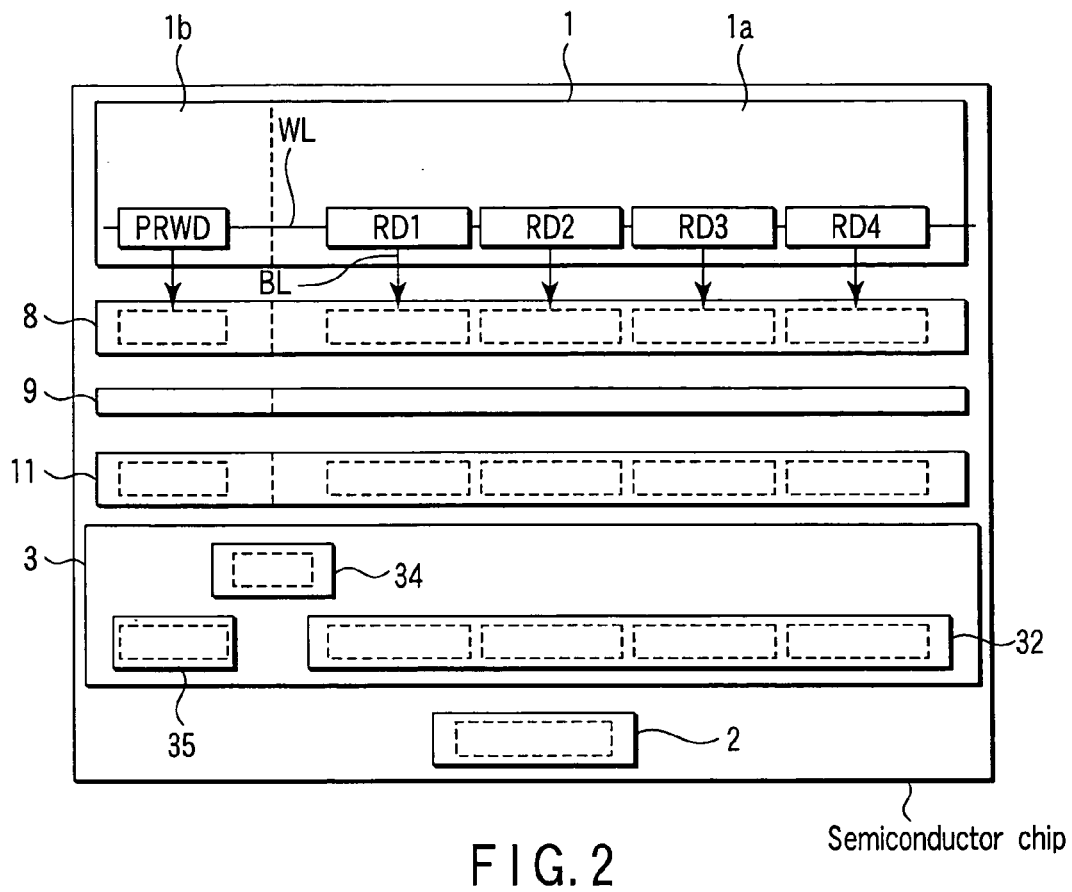
FIG. 2 is a view showing an example of the readout operation of the synchronous semiconductor memory device according to the first embodiment of this invention.

(1) Selection of the word line WL, readout of data (readout data: RD1 to RD4) from the normal data storing portion 1*a* and readout of check data (PRWD) from the parity data storing portion 1*b* (FIG. 2)

Figure 3:
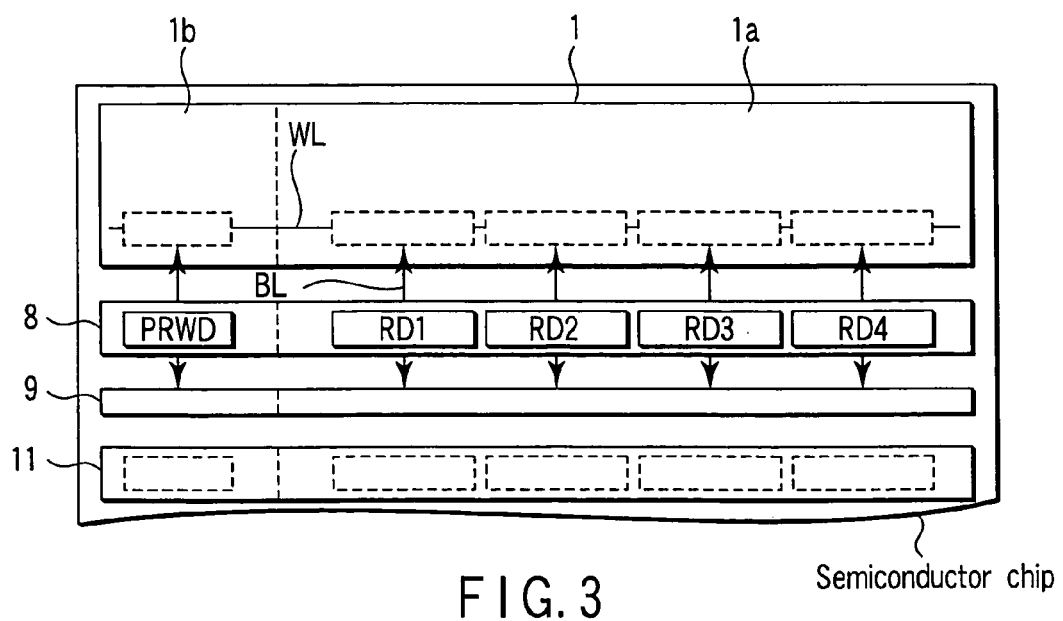
FIG. 3 is a view showing an example of the readout operation of the synchronous semiconductor memory device according to the first embodiment of this invention.

(2) Amplification and restoration of readout data/check data by the sense amplifier 8 (FIG. 3)

Figure 4:
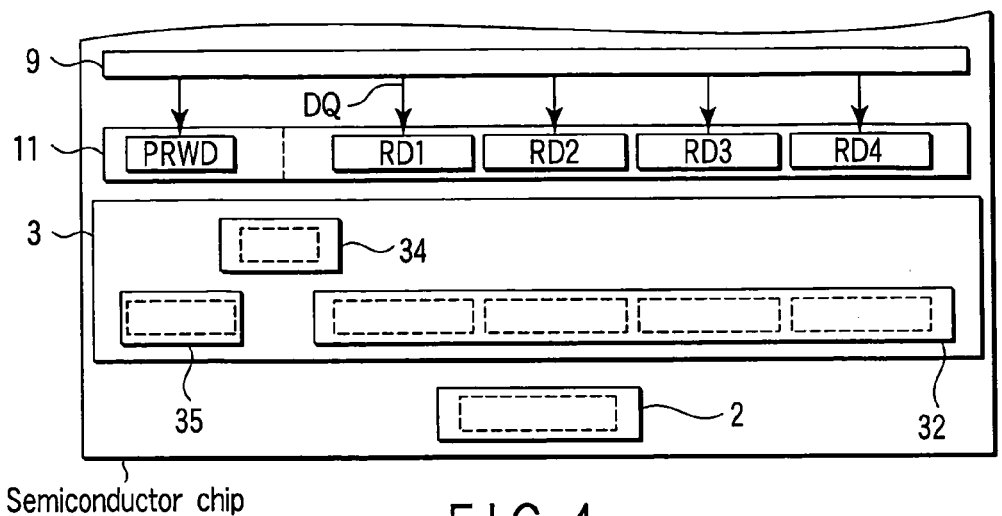
FIG. 4 is a view showing an example of the readout operation of the synchronous semiconductor memory device according to the first embodiment of this invention.

(3) Selection of the bit line BL and transfer of readout data/check data from the bit line BL to the DQ buffer (data line DQ) (FIG. 4)

Figure 5:
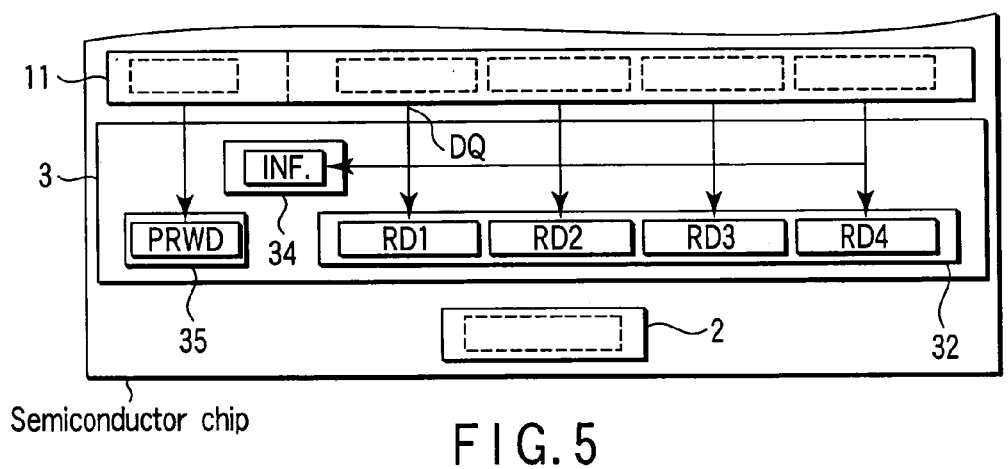
FIG. 5 is a view showing an example of the readout operation of the synchronous semiconductor memory device according to the first embodiment of this invention.

(4) Creation of information bit (INF.) based on readout data (FIG. 5)

Figure 6:
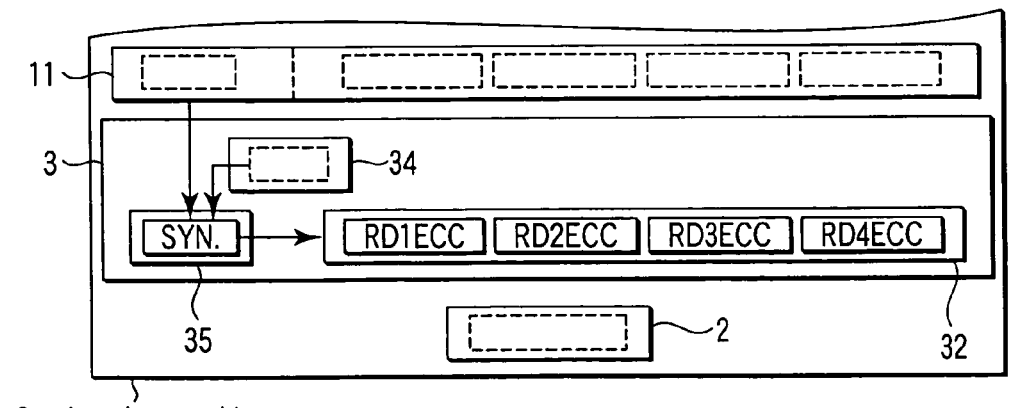
FIG. 6 is a view showing an example of the readout operation of the synchronous semiconductor memory device according to the first embodiment of this invention.

(5) Creation of the syndrome signal (SYN.) based on check data and information bit and decoding (error checking) and error correction of the syndrome signal (FIG. 6)

The above operations are terminated within a period of "two clocks" during the read latency in this example.

Figure 7:
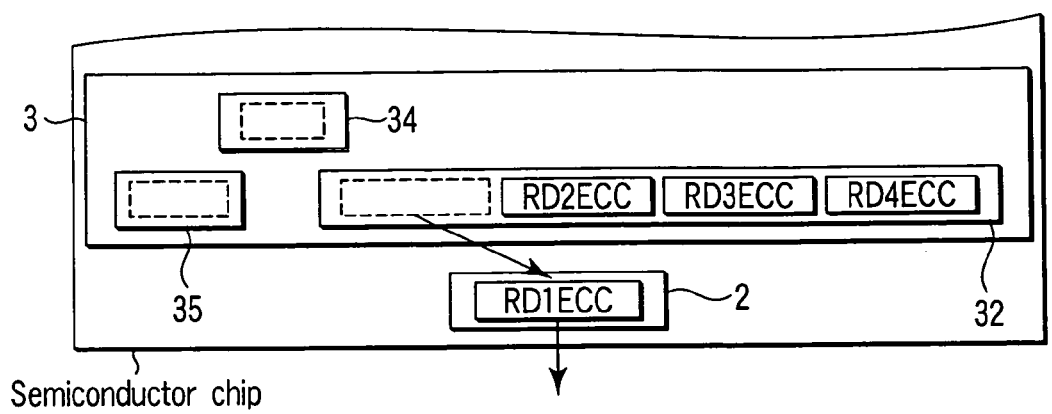
FIG. 7 is a view showing an example of the readout operation of the synchronous semiconductor memory device according to the first embodiment of this invention.
Figure 8:
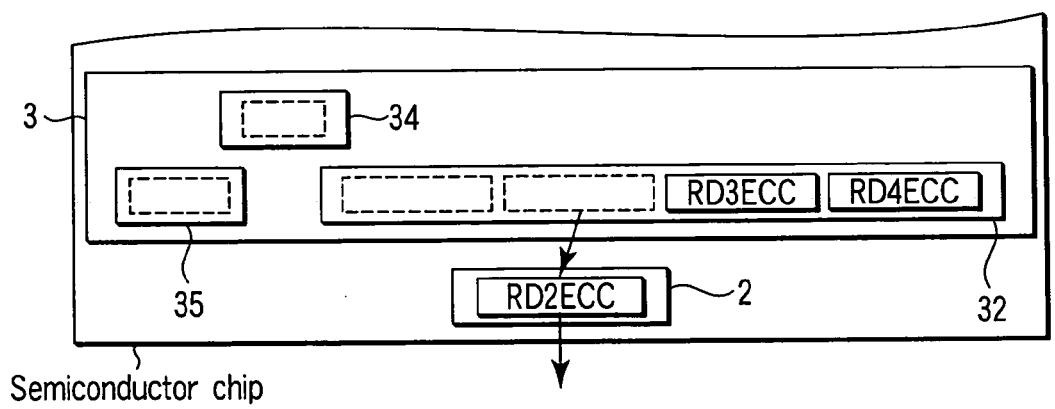
FIG. 8 is a view showing an example of the readout operation of the synchronous semiconductor memory device according to the first embodiment of this invention.
Figure 9:
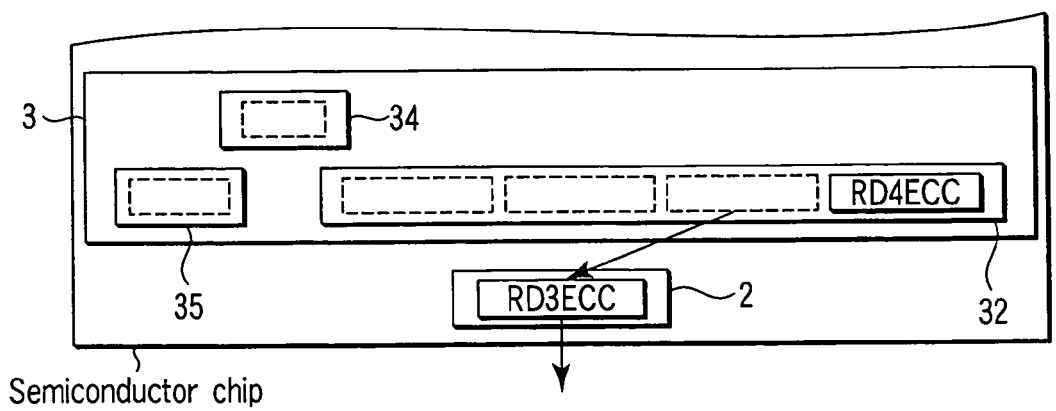
FIG. 9 is a view showing an example of the readout operation of the synchronous semiconductor memory device according to the first embodiment of this invention.
Figure 10:
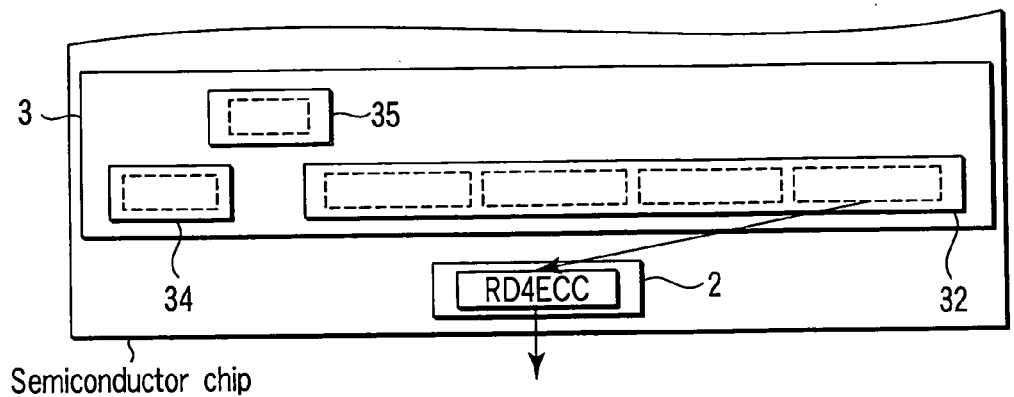
FIG. 10 is a view showing an example of the readout operation of the synchronous semiconductor memory device according to the first embodiment of this invention.

Next, as shown in FIG. 7, error-corrected readout data (RD1ECC) of "one word" is previously transferred from the read/write buffer 32 to the I/O buffer 2 so that first burst data can be output from the I/O buffer 2 to the I/O pin at the "second clock" time in this example after elapse of the read latency.

For example, the burst counter 4 starts the counting operation of the set burst length starting from the "second clock". Then, it generates an internal address for each count and supplies the internal address to a column decoder circuit of the read/write buffer 32 via the column address buffer 10. The read/write buffer 32 outputs error-corrected readout data for each count, word by word, based on the sequence set in the column decoder circuit. In this example, error-corrected readout data (RDLECC) is output at the "second clock" time (FIG. 7) (first burst data output). Then, the second, third and fourth burst data outputting operations are performed at the "third clock" time (FIG. 8), "fourth clock" time (FIG. 9) and "fifth clock" time (FIG. 10), respectively. As a result, the error-corrected data items (RD1ECC to RD4ECC) of the set burst length are output.

(Write Operation)

In the first embodiment, the above read operation is performed in the first half period of the write operation, that is, during the read latency to previously store error-corrected readout data in the read/write buffer 32. For example, when the read latency is set to "two clocks", the read operation is terminated within the "two clocks" after the address valid signal/ADV was transited to the "LOW" level. Thus, error-corrected readout data is previously stored in the read/write buffer 32. After this, readout data of "one word" is rewritten or converted to write data of "one word" at the "second clock" time. At this time, data of the remaining "three words" is error-corrected readout data. After this, a check bit is created based on data of four words in total containing the write data and readout data and written into the parity data storing portion 1*b* and the data of four words in total is written into the normal data storing portion 1*a*. The rewriting operation is performed for each count. FIGS. 12 to 17 visually show one example of the operation and FIG. 18 shows the operation waveform diagram of the operation. In one example of the operation, it is assumed that the read latency is set to "two clocks", the burst length is set to "four words" and the "one word" serial inputting/"four word" parallel writing operation is performed. Of course, the read latency and burst length are not limited to "two clocks" and "four words", respectively.

Figure 12:
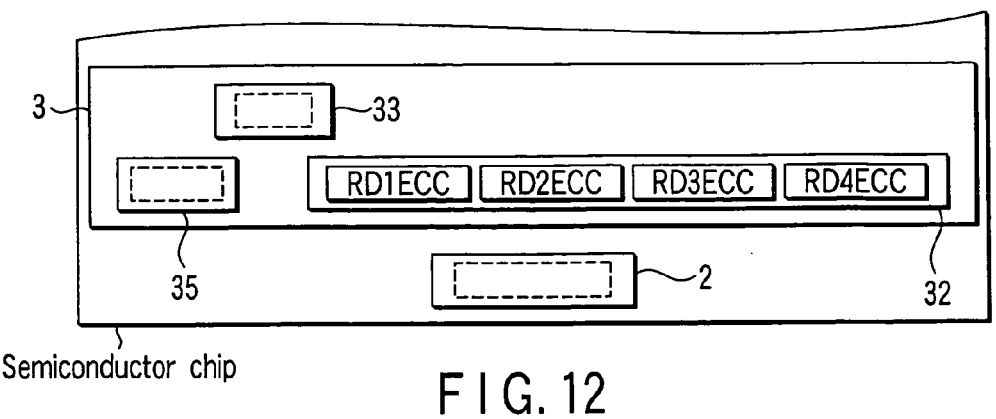
FIG. 12 is a view showing an example of the write operation of the synchronous semiconductor memory device according to the first embodiment of this invention.

First, as shown in FIG. 12, for example, error-corrected "four word" readout data items RD1ECC to RD4ECC are previously stored in the read/write buffer 32 during the read latency, for example, within the "two clocks" in this example according to the operation shown in FIGS. 2 to 6.

Figure 13:
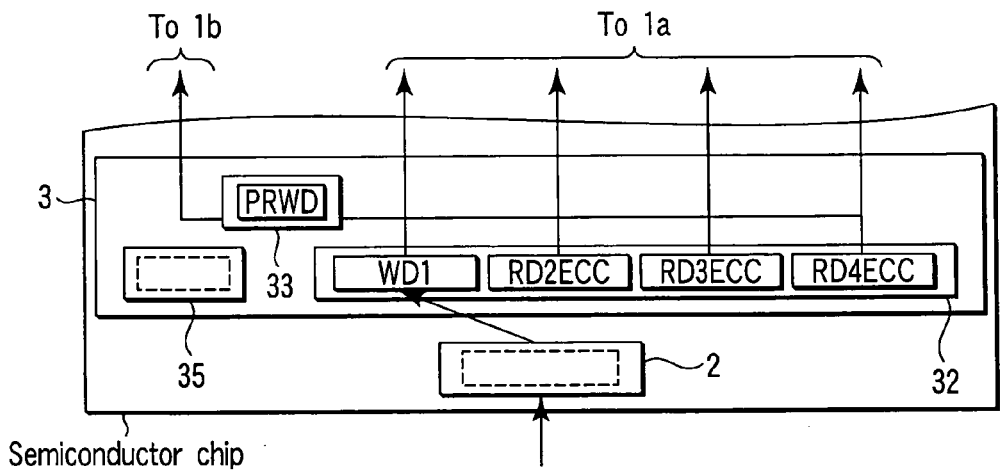
FIG. 13 is a view showing an example of the write operation of the synchronous semiconductor memory device according to the first embodiment of this invention.

Next, as shown in FIG. 13, write data WD1 of "one word" corresponding to the first burst data inputting cycle is input from the I/O buffer 2 into the read/write buffer 32 in the latter half period of the write operation, that is, after elapse of the read latency or after "two clocks" in this example. Further, the burst counter 4 generates an internal address for each count and supplies the same to the column decoder circuit of the read/write buffer 32 via the column address buffer 10. Thus, the readout data RD1ECC is rewritten to the write data WD1. After this, a check bit PRWD is created based on the write data WD1 and readout data RD2ECC to RD4ECC and written into the parity data storing portion 1b. Further, the write data WD1 and readout data RD2ECC to RD4ECC are written into the normal data storing portion 1a.

Figure 14:
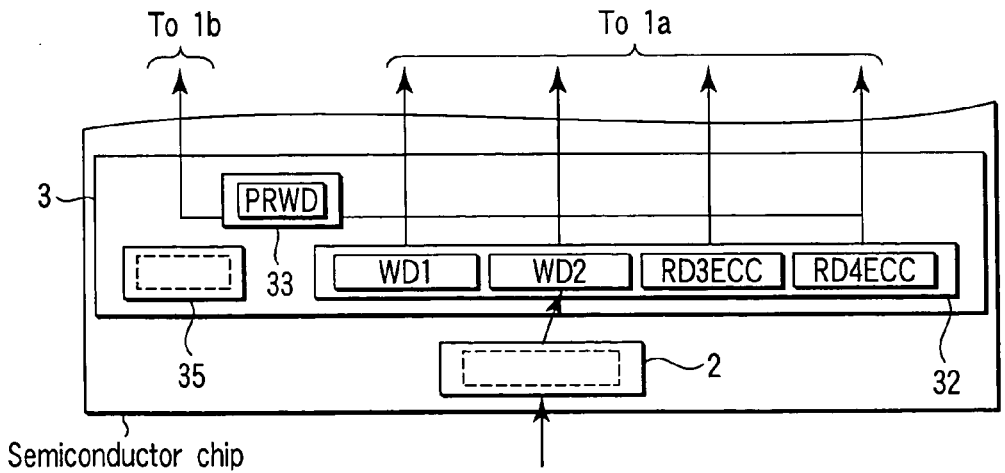
FIG. 14 is a view showing an example of the write operation of the synchronous semiconductor memory device according to the first embodiment of this invention.

Likewise, write data WD2 of "one word" corresponding to the second burst data inputting cycle is input to the read/write buffer 32 after "three clocks" and the readout data RD2ECC is rewritten to the write data WD2. After this, the data items WD1, WD2, RD3ECC, RD4ECC are written into the normal data storing portion 1a. At the same time, a check bit PRWD is created based on the write data items WD1, WD2, RD3ECC, RD4ECC and written into the parity data storing portion 1b (FIG. 14).

Figure 15:
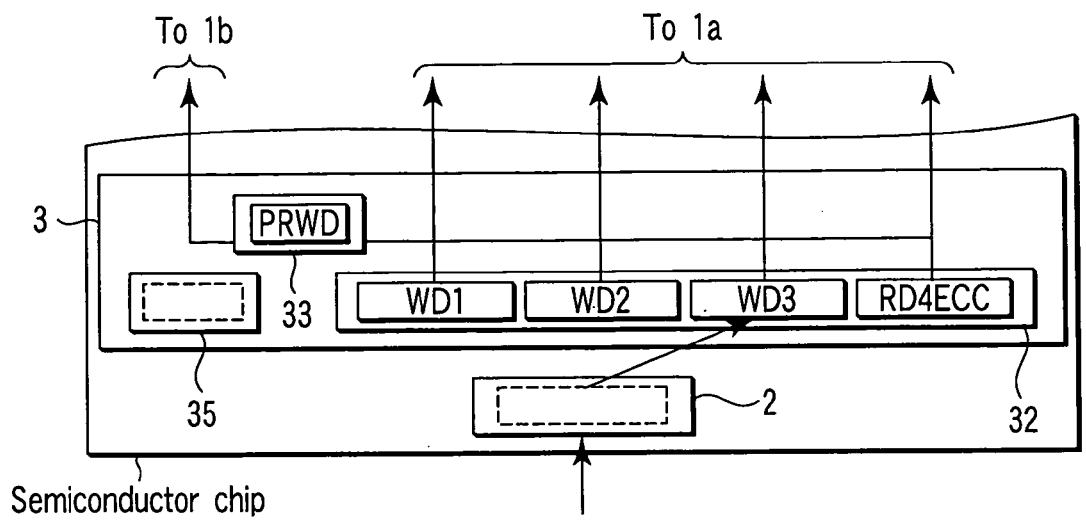
FIG. 15 is a view showing an example of the write operation of the synchronous semiconductor memory device according to the first embodiment of this invention.

Write data WD3 of "one word" corresponding to the third burst data inputting cycle is input to the read/write buffer 32 after "four clocks" and the readout data RD3ECC is rewritten to the write data WD3. After this, the data items WD1, WD2, WD3, RD4ECC are written into the normal data storing portion 1a. At the same time, a check bit PRWD is created based on the write data items WD1, WD2, WD3, RD4ECC and written into the parity data storing portion 1b (FIG. 15).

Figure 16:
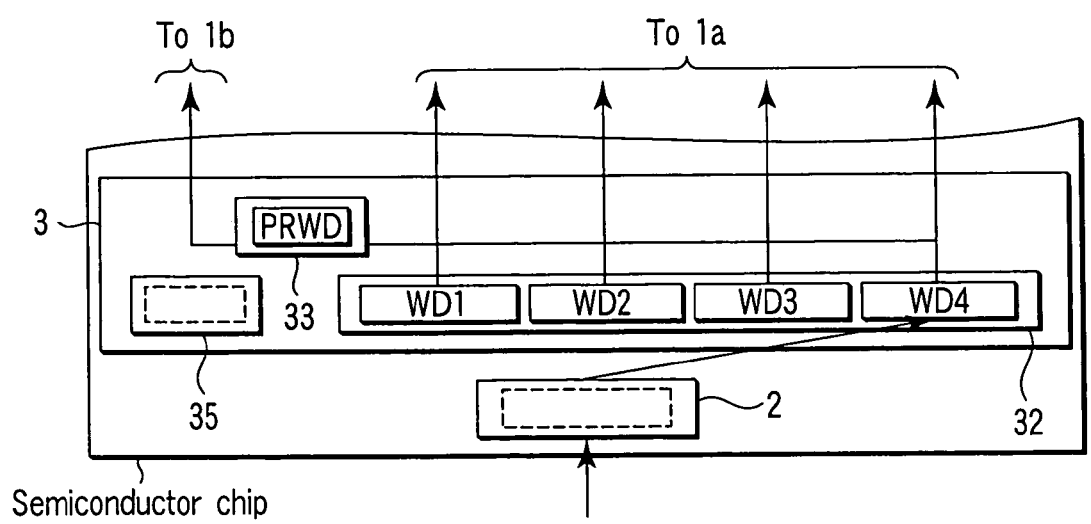
FIG. 16 is a view showing an example of the write operation of the synchronous semiconductor memory device according to the first embodiment of this invention.

Write data WD4 of "one word" corresponding to the fourth burst data inputting cycle is input to the read/write buffer 32 after "five clocks" and the readout data RD4ECC is rewritten to the write data WD4. After this, the data items WD1 to WD4 are written into the normal data storing portion 1a, and at the same time, a check bit PRWD is created based on the write data items WD1 to WD4 and written into the parity data storing portion 1b (FIG. 16).

Figure 17:
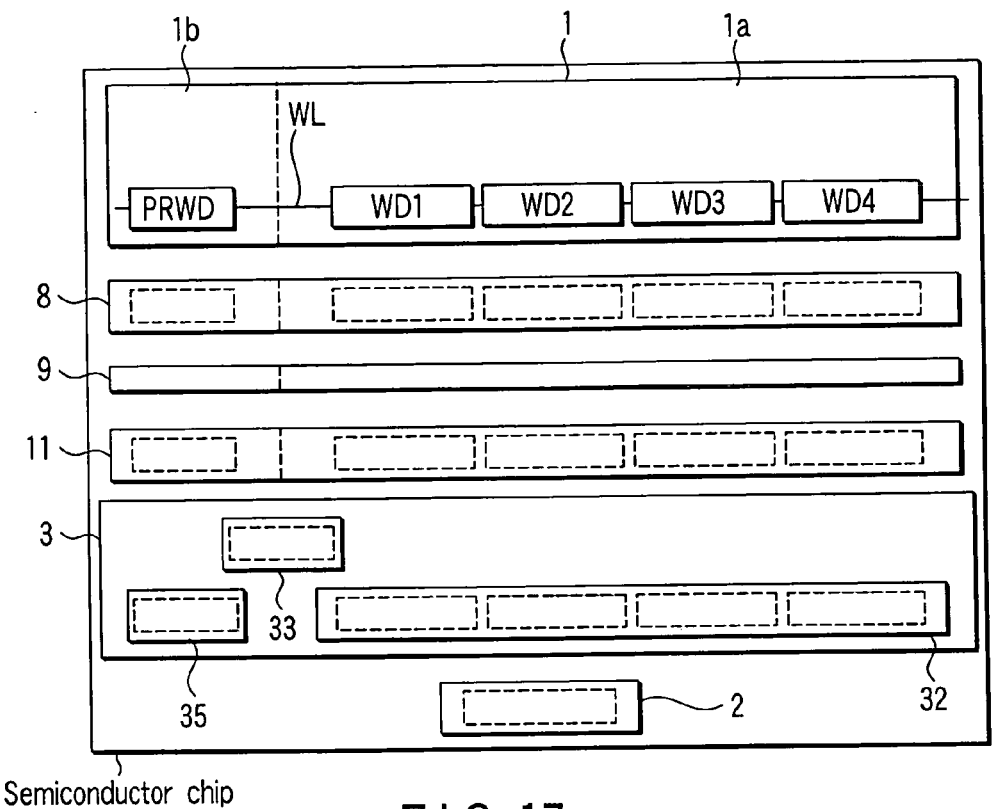
FIG. 17 is a view showing an example of the write operation of the synchronous semiconductor memory device according to the first embodiment of this invention.
Figure 18:
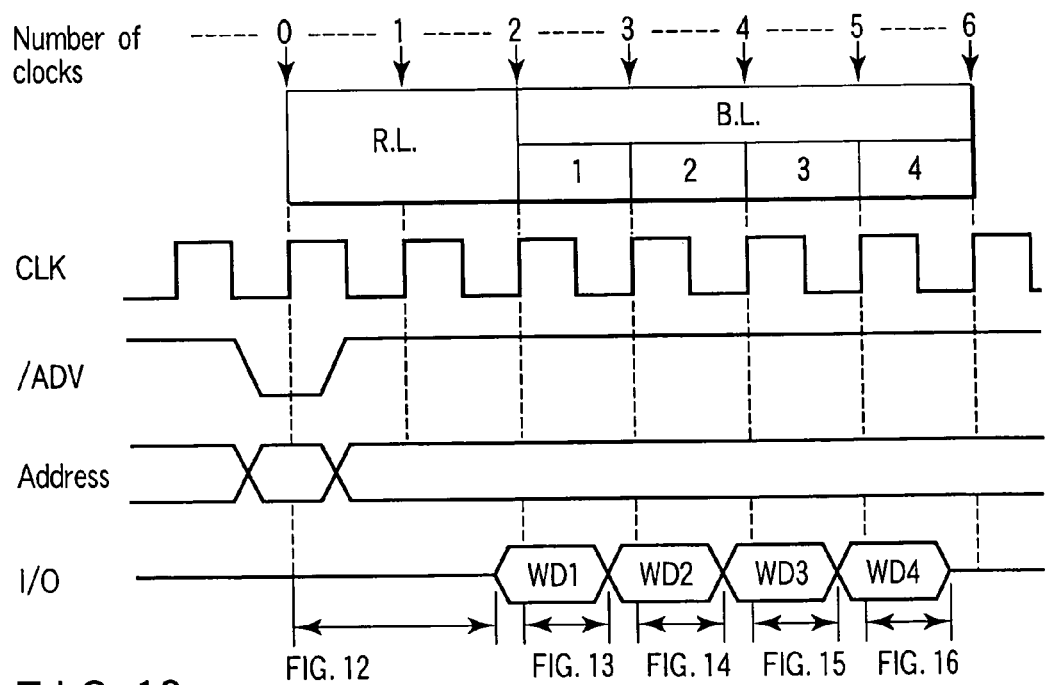
FIG. 18 is an operation waveform diagram showing an example of the write operation of the synchronous semiconductor memory device according to the first embodiment of this invention.

FIG. 17 shows data obtained after the write operation.

According to the device of the first embodiment, since the ECC operation is terminated during the read latency, it is possible to suppress deterioration of the access speed caused by addition of the ECC operation. Further, since the ECC operation is added, deterioration of the data holding characteristic caused by power saving can be suppressed. Therefore, both of the deterioration of the data holding characteristic caused by power saving and the deterioration of the access speed can be suppressed and, as a result, a semiconductor storing device with low power consumption and high operation speed can be attained.

Further, in the first embodiment, at the write operation time, error-corrected readout data is previously stored in the read/write buffer 32 in the first half period of the write operation, that is, during the read latency. After this, the error-corrected readout data is rewritten, word by word, to write data for each count in the latter half period of the write operation, that is, after elapse of the read latency and written together with the check bit into the normal data storing portion 1a and parity data storing portion 1b. In the case of the above write operation, the write data and check bit are written for each count into the normal data storing portion 1a and parity data storing portion 1b. Therefore, the burst data inputting operation can be interrupted in the course of the operation. Further, even when the burst data inputting operation is interrupted in the course of the operation, for example, the next operation can be performed without newly performing the ECC operation. The operation can suppress an useless operation and is advantageous in further enhancing the access speed, for example.

Further, in the first embodiment, it is assumed that, for example, the one-word serial inputting/four-word parallel writing operation, that is, the one-word serial inputting/multiword parallel writing operation is performed as the data write operation. However, the data write operation is not limited to the above case. For example, it is possible to perform the one-word serial inputting/one-word serial writing operation.

In the case of the one-word serial inputting/one-word serial writing operation, the same write operation as the above write operation example is performed until a check bit is created based on the write data and readout data, for example, data of four words in total and written into the parity data storing portion 1b. However, data to be written into the normal data storing portion 1a is limited to write data of one word input. Specifically, when the write operation is compared with the above write operation example, a check bit is created based on write data WD1 and readout data items RD2ECC to RD4ECC at the first burst data input time and written into the parity data storing portion 1b. The write data WD1 is written into the normal data storing portion 1a. Likewise, at the second burst data input time, a check bit is created based on data items WD1, WD2, RD3ECC, RD4ECC and written into the parity data storing portion 1b and the write data WD2 is written into the normal data storing portion 1a. At the third burst data input time, a check bit is created based on data items WD1, WD2, WD3, RD4ECC and written into the parity data storing portion 1b and the write data WD3 is written into the normal data storing portion 1a. At the fourth burst data input time, a check bit is created based on data items WD1, WD2, WD3, WD4 and written into the parity data storing portion 1b and the write data WD4 is written into the normal data storing portion 1a.

According to the above one-word serial inputting/one-word serial writing operation, since only the one-word writing operation is performed, it is possible to attain the advantage that the operating circuit can be suppressed to the minimum size and a larger power saving can be attained in comparison with the one-word serial inputting/multiword parallel writing operation.

The one-word serial inputting/one-word serial writing operation can be applied to all of the embodiments described below.

SECOND EMBODIMENT

The second embodiment is an example in which the first embodiment is explained in more detail and is an example of a PSRAM with burst mode having burst length of "four words" and I/O of "16 I/Os=16 bits=one word".

FIG. 19 is a block diagram showing an example of the configuration of a synchronous semiconductor memory device with an ECC circuit according to the second embodiment of this invention. In the second embodiment, as one example of the specification, it is assumed that the "four word" parallel reading/"one word" serial outputting operation is performed at the read operation time and the "one word" serial inputting/"four word" parallel writing operation is performed at the write operation time. The number of bits which are read/written at one time with respect to a normal data storing portion 1a is 64 bits (=B.L.×I/O=four words×16 bits). Further, the number of bits which are read/written at one time with respect to a parity data storing portion 1b is 8 bits. Like the first embodiment, an ECC circuit 3 performs a single-error-correction operation by using a hamming-code as an error correction code, for example.

The device according to the second embodiment is explained below in detail based on one example of the operation.

(Read Operation)

At the read operation time, the ECC circuit 3 reads out 64-bit data from the normal data storing portion 1a and creates 8-bit information data based on 64-bit readout data in an information bit generating circuit 34. Further, the ECC circuit 3 reads out 8-bit check data from the parity data storing portion 1b in addition to the 64-bit readout data. A syndrome generation circuit 35 compares the 8-bit information data and 8-bit check data with each other to generate an 8-bit syndrome signal. The 64-bit readout data is subjected to the 1-bit error checking and error correcting process according to the 8-bit check data in a syndrome decode/error correction circuit 31. Also, like the first embodiment, in the second embodiment, the ECC operation for the 64-bit readout data is terminated during the set read latency.

After elapse of the read latency, a burst counter 4 generates an internal address. The internal address is supplied for each count to a column decoder circuit in a read/write buffer 32 via a column address buffer 10. The read/write buffer 32 outputs 16-bit readout data for each count based on the sequence set in the column decoder circuit. In this example, after elapse of the read latency, for example, 16-bit readout data is output four times for each clock.

(Write Operation)

The above read operation is performed in the first half period of the write operation, that is, during the set read latency and 64-bit error-corrected readout data is previously stored in the read/write buffer 32.

The burst counter 4 generates an internal address for each count and supplies the same to the column decoder circuit of the read/write buffer 32 via the column address buffer 10 in the latter half period of the write operation, that is, after elapse of the read latency. The read/write buffer 32 rewrites the 64-bit error-corrected readout data for each count to input write data for every 16 bits based on the sequence set in the column decoder circuit. Then, a check bit is generated and written into the parity data storing portion 1b for each count and write data is written into the normal data storing portion 1a. The above operation is repeatedly performed for the burst length four times in this example.

In the second embodiment, the same effect as that of the first embodiment can be attained.

In the second embodiment, it is assumed that the burst length is set to "four words", the I/O is set to "16 I/Os" and the number of bits which can be read/written at a time with respect to the normal data storing portion 1a is "64 bits". That is, it is an example in which "the number of bits which can be simultaneously read/written=B.L.×I/O". For example, the burst length can be set according to the request of the user or freely set by the user. Therefore, the burst length becomes longer and may be set to "the number of bits which can be simultaneously read/written<B.L.×I/O" in some cases. Some examples of the devices which can cope with the above case are explained below as third and fourth embodiments.

THIRD EMBODIMENT

The device according to the third embodiment relates to an example in which the burst length is long. In the following explanation, it is assumed that a PSRAM with burst mode having burst length of "eight words" and I/O of "one word=16 I/Os=16 bits" is used. In the PSRAM, if it is assumed that the "eight word" parallel reading/"one word" serial outputting operation is performed, the number of bits which are read/written at one time with respect to a normal data storing portion 1a is 128 bits (=B.L.×I/O=eight words× 16 bits). The number of bits is twice that of the device according to the second embodiment.

When the number of bits which are simultaneously read/written is large, the rate of relieving errors by use of an ECC circuit 3 is generally deteriorated. Further, the error relieving rate is deteriorated and the number of bits of a syndrome signal becomes larger, which makes the ECC operation complicated, and requires a long time to perform the ECC operation. As a result, it becomes difficult to terminate the ECC operation during the set read latency.

The third embodiment is made to suppress deterioration of the error relieving rate and reduce the time required for the ECC operation even when the number of bits which are simultaneously read/written is large.

Figure 20:
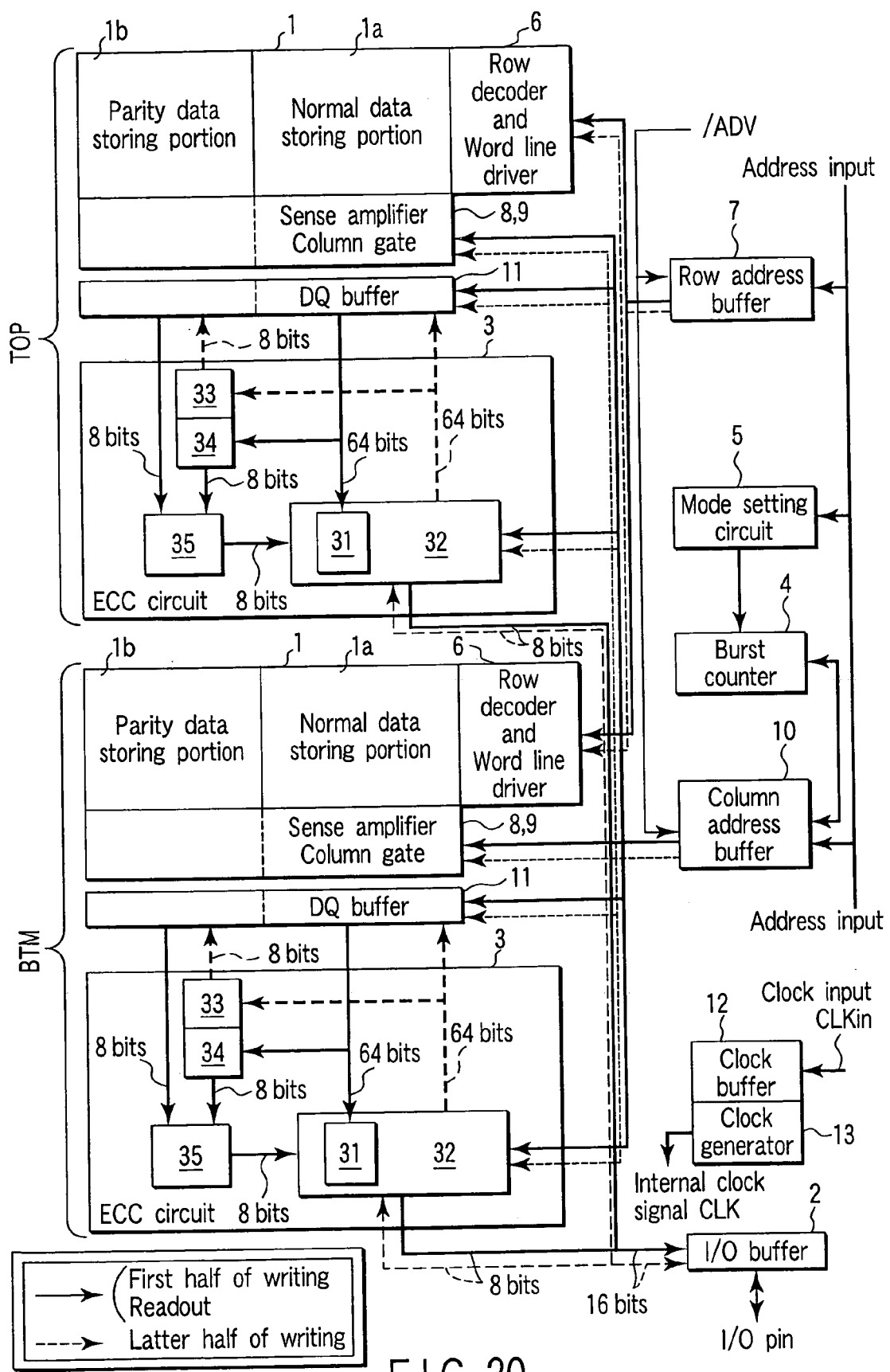
FIG. 20 is a block diagram showing an example of the configuration of a synchronous semiconductor memory device according to a third embodiment of this invention.

FIG. 20 is a block diagram showing an example of the configuration of a synchronous semiconductor memory device according to the third embodiment of this invention.

As shown in FIG. 20, in the third embodiment, for example, two ECC circuits each having the same circuit scale as that of the ECC circuit 3 in the second embodiment are used. Specifically, the third embodiment is a memory having two sets of memories (upper-side memory TOP/lower-side memory BTM) in which the number of bits simultaneously read/written is set to "the normal data storing portion 1a=64 bits" and "the parity data storing portion 1b=8 bits". Like the first and second embodiments, the ECC circuit 3 of this example performs a single-error-correction operation by using a hamming-code as an error correction code, for example. The operation of the device is explained below. The operation of the upper-side memory TOP is the same as the lower-side memory BTM.

(Read Operation)

At the read operation time, the ECC circuit 3 of the upper-side memory TOP reads out 64-bit data from the normal data storing portion 1a of the upper-side memory TOP and creates 8-bit information data based on 64-bit readout data in an information bit generating circuit 34. Further, the ECC circuit 3 of the upper-side memory TOP reads out 8-bit check data from the parity data storing portion 1b of the upper-side memory TOP in addition to the 64-bit readout data. A syndrome generation circuit 35 compares the 8-bit information data and 8-bit check data with each other to generate an 8-bit syndrome signal. The 64-bit readout data is subjected to the 1-bit error checking and error correcting process according to the 8-bit syndrome signal in a syndrome decode/error correction circuit 31.

The above operation is simultaneously performed in the upper-side memory TOP and lower-side memory BTM, for example, and error-corrected readout data of 128 bits obtained from a combination of the upper-side memory TOP and lower-side memory BTM is generated. The operation is terminated during the set read latency.

After elapse of the read latency, a burst counter 4 generates an internal address (burst address) for each count. The internal address is supplied to a column decoder circuit in a read/write buffer 32 of the upper-side memory TOP and a column decoder circuit in a read/write buffer 32 of the lower-side memory BTM via a column address buffer 10. The read/write buffers 32 output readout data of 16 bits in total (=one word) containing eight bits of the upper-side memory TOP and eight bits of the lower-side memory BTM for each count based on the sequences set in the column decoder circuits. In this example, for example, 16-bit readout data is output eight times for each clock.

(Write Operation)

The above read operation is performed in the first half period of the write operation, that is, during the set read latency. Then, error-corrected readout data of 128 bits in total containing 64 bits for the read/write buffer 32 of the upper-side memory TOP and 64 bits for the read/write buffers 32 of the lower-side memory BTM is stored in a combination of the read/write buffers 32.

The burst counter 4 creates an internal address for each count in the latter half period of the write operation, that is, after elapse of the read latency. Then, it supplies the internal address to the column decoder circuit of the read/write buffer 32 of the upper-side memory TOP and the column decoder circuit of the read/write buffer 32 of the lower-side memory BTM via the column address buffer 10. The read/write buffers 32 rewrite the 128-bit error-corrected readout data to input write data for each count for every 16 bits in total containing eight bits for the upper-side memory TOP and eight bits for the lower-side memory BTM based on the sequences set in the column decoder circuits. Then, each of the read/write buffers 32 generates and writes check bits into the parity data storing portion 1b for each count and writes write data into the normal data storing portion 1a.

Thus, readout data of 128 bits in total containing 64 bits for each of the upper-side and lower-side memories is written into a combination of the upper-side memory TOP and the lower-side memory BTM.

Figure 21:
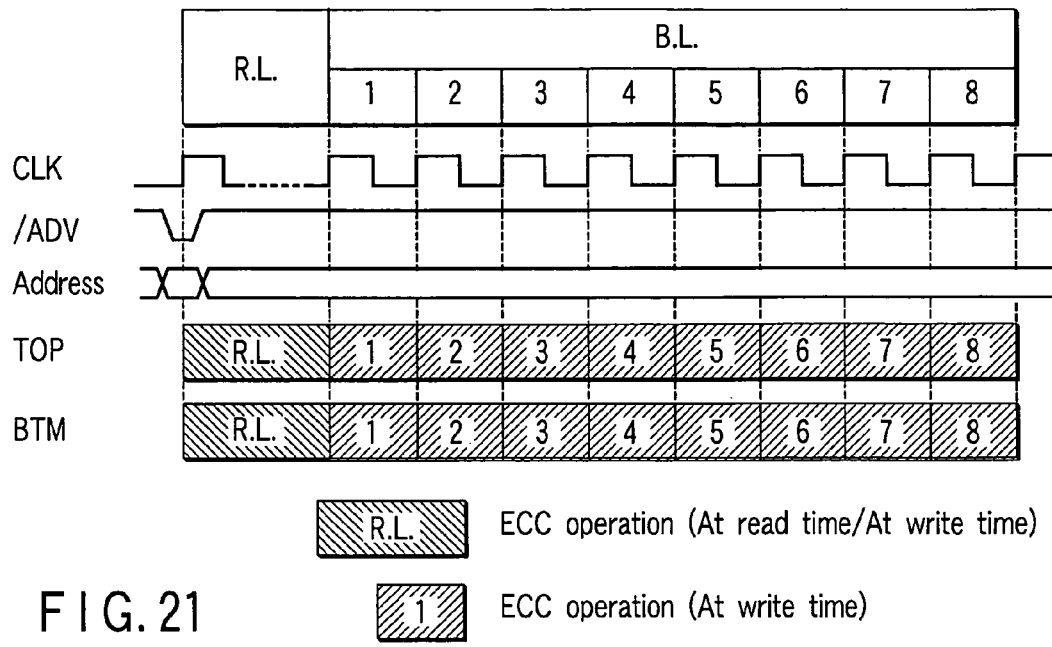
FIG. 21 is a diagram showing the outline of the ECC operation of the synchronous semiconductor memory device according to the third embodiment of this invention.

The outline of the ECC operation of the device according to the third embodiment is shown in FIG. 21.

According to the third embodiment, the same effects as those of the first and second embodiments can be attained even when the burst length is long and it is difficult to terminate the ECC operation during the set read latency.

Further, according to the third embodiment, since the ECC operation is performed in each memory TOP/BTM, deterioration in the error relieving rate can be suppressed even when the number of bits which are simultaneously read/written is large.

In the third embodiment, it is assumed that the burst length is set to "eight words", I/O is set to "16 I/Os" and the number of bits which can be simultaneously read/written with respect to the normal data storing portion 1a of each memory TOP/BTM is 64 bits, that is, the total number of bits is 128 bits. In other words, the third embodiment is equivalent to the example of "the number of bits which can be simultaneously read/written=B.L.×I/O".

For example, the burst length can be set according to the request of the user or freely set by the user. Therefore, the burst length may be set to "the number of bits which can be simultaneously read/written>B.L.×I/O" in some cases. For example, if the burst length is set to "four words", 64 bits are left over in this example since 64 bits can be simultaneously read/written. In this case, it is sufficient to operate only one of the ECC circuits 3 of the memories TOP/BTM.

FOURTH EMBODIMENT

Like the third embodiment, the fourth embodiment relates to an example in which the burst length is long. In the fourth embodiment, a memory of "B.L.×I/O=the number of bits which can be subjected to the ECC process during the set read latency", specifically, for example, a memory of "four words×16=64 bits" is considered as one set. A plurality of sets of the memories are provided in one chip and the operation of the ECC circuit is flexibly and variably performed. As a result, for example, a case wherein the burst length is long and the ECC operation cannot be terminated during the set read latency can be coped with.

Figure 22:
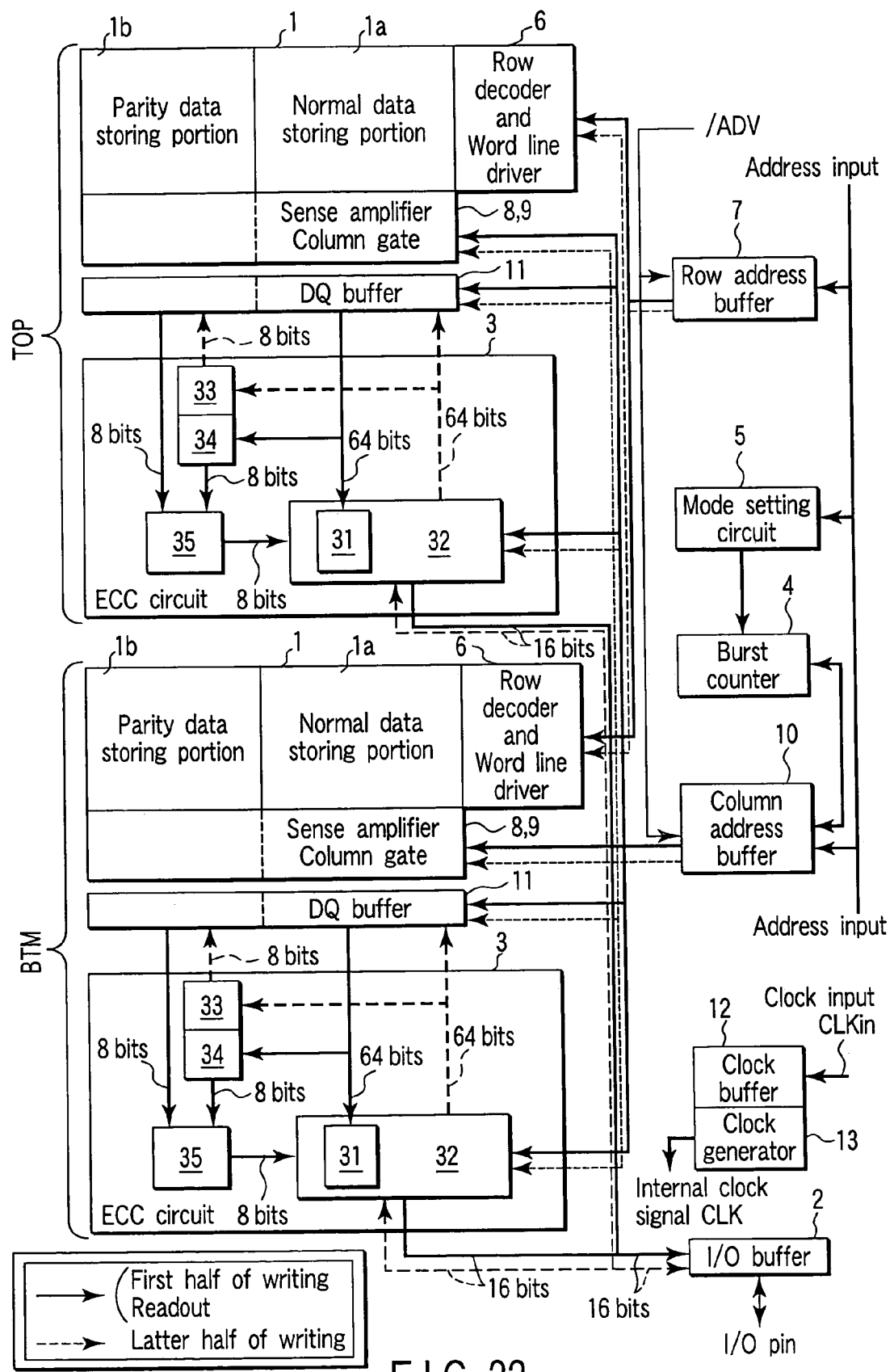
FIG. 22 is a block diagram showing an example of the configuration of a synchronous semiconductor memory device according to a fourth embodiment of this invention.

FIG. 22 is a block diagram showing an example of the configuration of a synchronous semiconductor memory device according to the fourth embodiment of this invention.

As shown in FIG. 22, in the fourth embodiment, two sets of memories which are the same as the memory of the second embodiment are used. More specifically, there are provided two sets of memories (upper-side memory TOP/lower-side memory BTM) each of which is the same as a memory in which the number of bits simultaneously read/written is set to "a normal data storing portion 1a=64 bits" and "a parity data storing portion 1b=8 bits". Like the first to third embodiments, the ECC circuit 3 of this example performs a single-error-correction operation by using a hamming-code as an error correction code, for example. Some examples of the operation are explained below.

FIRST EXAMPLE

In the first example, it is assumed that the burst length is set to "eight words" and I/O is set to "16 I/Os=16 bits=one word".

(Read Operation)

At the read operation time, the ECC circuits 3 of the upper-side memory TOP and lower-side memory BTM perform the same operation as in the second embodiment, for example, and the ECC operations for 64-bit readout data are terminated during the set read latency. Thus, error-corrected readout data of 128 bits in total is set in a combination of the upper-side memory TOP and lower-side memory BTM.

After elapse of the read latency, a burst counter 4 generates internal addresses for each count. In this example, eight internal addresses are generated and the first four internal addresses are supplied for each count to a column decoder circuit in a read/write buffer 32 of the upper-side memory TOP via a column address buffer 10. The read/write buffer 32 of the upper-side memory TOP outputs 16-bit readout data for each count four times in total based on the sequence set in the column decoder circuit. During the above operation, the ECC circuit 3 of the lower-side memory BTM is not operated.

Next, the remaining four internal addresses are supplied for each count to a column decoder circuit in a read/write buffer 32 of the lower-side memory BTM via the column address buffer 10. The read/write buffer 32 of the lower-side memory BTM outputs 16-bit readout data for each count four times in total based on the sequence set in the column decoder circuit after outputting of data from the upper-side memory TOP. While data is being output from the lower-side memory BTM, the ECC circuit 3 of the upper-side memory TOP is not operated.

Thus, burst data is output eight times in total from the upper-side memory TOP and lower-side memory BTM.

(Write Operation)

The above read operation is performed in the first half period of the write operation, that is, during the set read latency and error-corrected readout data of 128 bits in total is previously set in a combination of the upper-side memory TOP and lower-side memory BTM.

The burst counter 4 generates internal addresses for each count in the latter half period of the write operation, that is, after elapse of the read latency. In this example, it generates eight internal addresses and supplies the first four internal addresses for each count to the column decoder circuit of the read/write buffer 32 of the upper-side memory TOP via the column address buffer 10. The read/write buffer 32 of the upper-side memory TOP rewrites 64-bit error-corrected readout data to input write data for each count for every 16 bits based on the sequences set in the column decoder circuit. Then, the read/write buffer 32 generates and writes a check bit into the parity data storing portion 1b for each count and writes write data into the normal data storing portions 1a. During the above operation, the ECC circuit 3 of the lower-side memory BTM is not operated.

Next, the remaining four internal addresses are supplied for each count to the column decoder circuit in the read/write buffer 32 of the lower-side memory BTM via the column address buffer 10. The read/write buffer 32 of the lower-side memory BTM rewrites 64-bit error-corrected readout data to the input write data for each count for every 16 bits based on the sequence set in the column decoder circuit. Then, the read/write buffer 32 generates and writes a check bit into the parity data storing portion 1b for each count and writes write data into the normal data storing portion 1a. During the above operation, the ECC circuit 3 of the upper-side memory TOP is not operated.

Thus, write data of 128 bits in total containing 64 bits in each of the upper-side memory TOP and lower-side memory BTM is created in a combination of the upper-side memory TOP and lower-side memory BTM.

Figure 23:
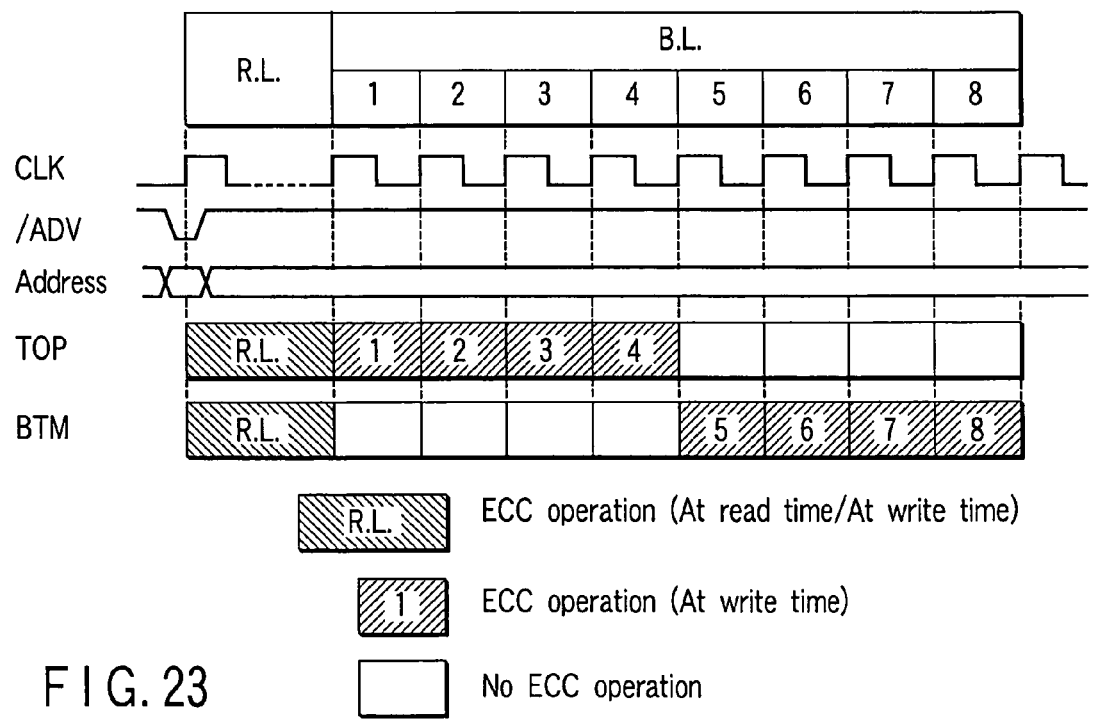
FIG. 23 is a diagram showing the outline of the ECC operation of a first example of the synchronous semiconductor memory device according to the fourth embodiment of this invention.

The outline of the ECC operation of the device according to the first example of the fourth embodiment is shown in FIG. 23.

Like the third embodiment, in the first example of the fourth embodiment, the same effect as those of the first and second embodiments can be attained even when the burst length is long and it is difficult to terminate the ECC operation during the set read latency.

Further, since the ECC operation is performed in the respective memories TOP/BTM as in the third embodiment, deterioration in the error relieving rate can be suppressed.

In the first example of the fourth embodiment, it is assumed that the burst length is set to "eight words", I/O is set to "16 I/Os" and the number of bits which can be simultaneously read/written with respect to the normal data storing portion 1a of each memory TOP/BTM is 64 bits, that is, the total number of bits is 128 bits. In other words, this case is equivalent to the example of "the number of bits which can be simultaneously read/written=B.L.×I/O".

Like the third embodiment, in the present example, a case of "the number of bits which can be simultaneously read/written>B.L.×I/O" may occur in some cases. For example, if the burst length is set to "four words", it is sufficient to operate only one of the ECC circuits 3 of the memories TOP/BTM like the case of the third embodiment.

On the other hand, if the burst length is made further longer, a case of "the number of bits which can be simultaneously read/written<B.L.×I/O" may occur in some cases. One example of a device which can cope with this case is explained below as a second example of the fourth embodiment.

SECOND EXAMPLE

In the second example, a PSRAM with burst mode is assumed in which the burst length is set to "16 words" which is longer than in the first example and I/O is set to "16 I/Os=16 bits=one word".

(Read Operation)

At the read operation time, the ECC circuits 3 of the upper-side memory TOP and lower-side memory BTM perform the same operation as in the second embodiment, for example, and the ECC operations for 64-bit readout data are terminated during the set read latency. Thus, error-corrected readout data of 128 bits in total is first set in a combination of the upper-side memory TOP and lower-side memory BTM.

After elapse of the read latency, the burst counter 4 generates internal addresses for each count. In this example, it generates 16 internal addresses. Like the first example, the first four internal addresses are supplied for each count to the column decoder circuit in the read/write buffer 32 of the upper-side memory TOP. The read/write buffer 32 of the upper-side memory TOP outputs 16-bit readout data for each count four times in total based on the sequence set in the column decoder circuit. During the above operation, the ECC circuit 3 of the lower-side memory BTM is not operated.

Next, like the first example, the next four internal addresses are supplied for each count to the column decoder circuit in the read/write buffer 32 of the lower-side memory BTM. The read/write buffer 32 of the lower-side memory BTM outputs 16-bit readout data for each count four times in total based on the sequence set in the column decoder circuit after outputting of data from the upper-side memory TOP.

During the above operation, the read operation of data of the remaining 64 bits and the ECC operation for the readout data are performed in the upper-side memory TOP. Thus, 64-bit error-corrected readout data is set in the upper-side memory TOP.

After this, the next four internal addresses are supplied for each count to the column decoder circuit in the read/write buffer 32 of the upper-side memory TOP. The read/write buffer 32 of the upper-side memory TOP outputs 16-bit readout data for each count four times in total based on the sequence set in the column decoder circuit after outputting of data from the lower-side memory BTM.

During the above operation, the read operation of data of the remaining 64 bits and the ECC operation for the readout data are performed in the lower-side memory BTM. Thus, 64-bit error-corrected readout data is set in the lower-side memory BTM.

Further, the remaining four internal addresses are supplied for each count to the column decoder circuit in the read/write buffer 32 of the lower-side memory BTM. The read/write buffer 32 of the lower-side memory BTM outputs 16-bit readout data for each count four times in total based on the sequence set in the column decoder circuit after outputting of data from the upper-side memory TOP. During the above operation, the ECC circuit 3 of the upper-side memory TOP is not operated.

Thus, burst data is output 16 times in total from the upper-side memory TOP and low-side memory BTM.

(Write Operation)

The above read operation is performed in the first half period of the write operation, that is, during the set read latency, and error-corrected readout data of 128 bits in total is first set in a combination of the upper-side memory TOP and lower-side memory BTM.

The burst counter 4 generates internal addresses for each count after elapse of the read latency. In this example, it generates 16 internal addresses and supplies the first four internal addresses for each count to the column decoder circuit of the read/write buffer 32 of the upper-side memory TOP like the case of the first embodiment. As a result, in the read/write buffer 32 of the upper-side memory TOP, 64-bit error-corrected readout data is sequentially rewritten to input write data for each count for every 16 bits. Then, the read/write buffer 32 generates and writes a check bit into the parity data storing portion 1b for each count and writes write data into the normal data storing portions 1a.

During the above operation, the ECC circuit 3 of the lower-side memory BTM is not operated.

After this, like the first example, the next four internal addresses are supplied for each count to the column decoder circuit in the read/write buffer 32 of the lower-side memory BTM. Thus, in the read/write buffer 32 of the lower-side memory BTM, 64-bit error-corrected readout data is sequentially rewritten to input write data for each count for every 16 bits. Then, the read/write buffer 32 generates and writes a check bit into the parity data storing portion 1b for each count and writes write data into the normal data storing portions 1a.

During the above operation, the read operation of data of the remaining 64 bits and the ECC operation for the readout data are performed in the upper-side memory TOP. Thus, error-corrected readout data of the remaining 64 bits is set in the upper-side memory TOP.

Then, the next four internal addresses are supplied for each count to the column decoder circuit in the read/write buffer 32 of the upper-side memory TOP. Thus, in the read/write buffer 32 of the upper-side memory TOP, 64-bit error-corrected readout data is sequentially rewritten to input write data for each count for every 16 bits. Then, the read/write buffer 32 generates and writes a check bit into the parity data storing portion 1b for each count and writes write data into the normal data storing portions 1a.

During the above operation, the read operation of data of the remaining 64 bits and the ECC operation for the readout data are performed in the lower-side memory BTM. Thus, error-corrected readout data of the remaining 64 bits is set in the lower-side memory BTM.

Then, the remaining four internal addresses are supplied for each count to the column decoder circuit in the read/write buffer 32 of the lower-side memory BTM. Thus, in the read/write buffer 32 of the lower-side memory BTM, 64-bit error-corrected readout data is sequentially rewritten to input write data for each count for every 16 bits. Then, the read/write buffer 32 generates and writes a check bit into the parity data storing portion 1b for each count and writes write data into the normal data storing portions 1a.

Thus, write data of 128 bits in total, containing the remaining 64 bits in each of the upper-side memory TOP and lower-side memory BTM, is set in the upper-side memory TOP and lower-side memory BTM.

Figure 24:
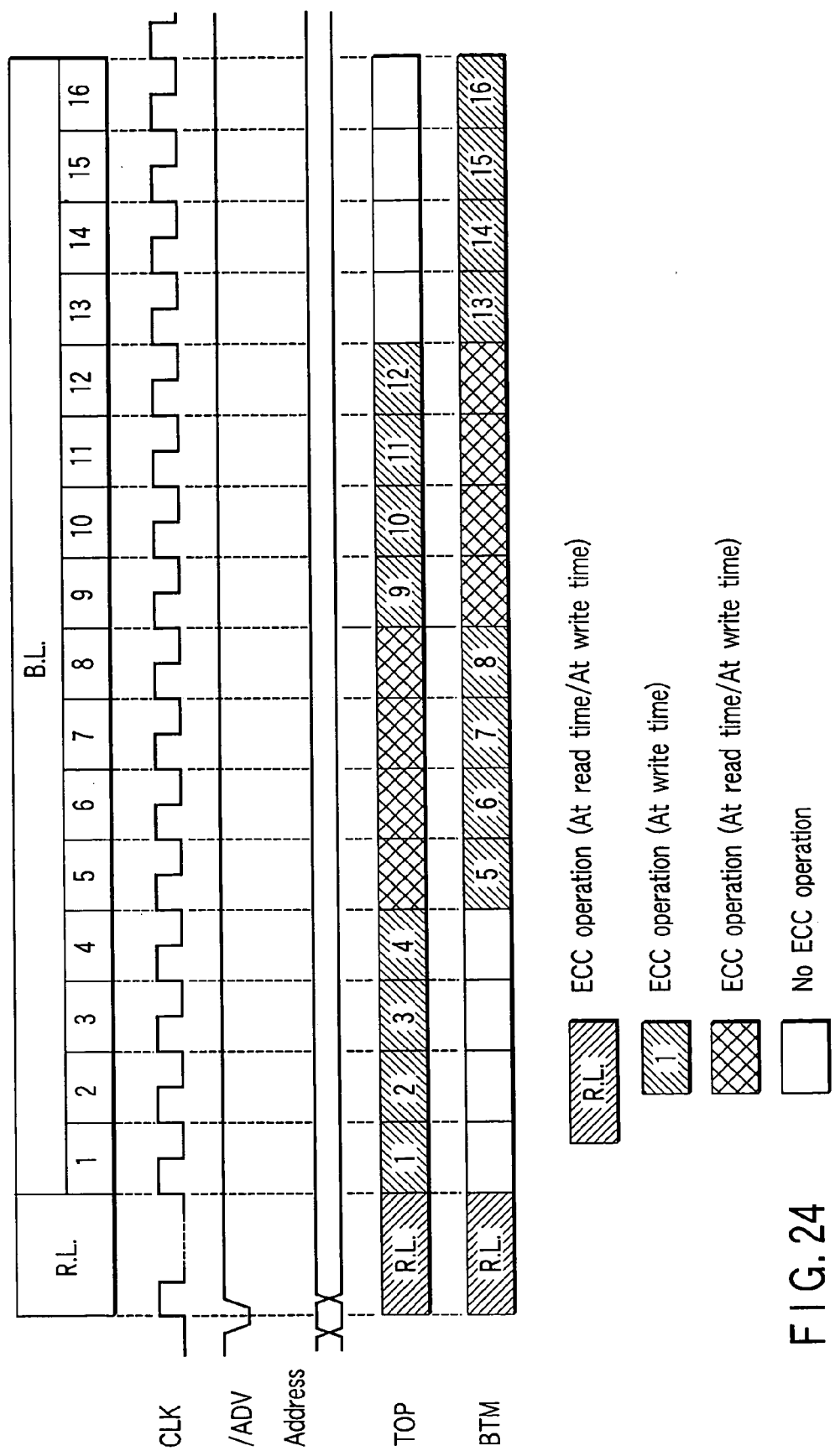
FIG. 24 is a diagram showing the outline of the ECC operation of a second example of the synchronous semiconductor memory device according to the fourth embodiment of this invention.

The outline of the ECC operation of the device according to the second example of the fourth embodiment is shown in FIG. 24. In FIG. 24, a case wherein the ECC operations for the second data readout operation and the second data write operation are performed by use of four clocks, which corresponds in number to the number of clocks required for the burst data output/input operation of the upper-side memory TOP or lower-side memory BTM, is described. Of course, it is possible to terminate the ECC operation by use of four clocks, but time required for the ECC operation can be freely set. For example, it is possible to terminate the ECC operation by use of one clock. In this case, however, the ECC operation must be terminated before the second burst data outputting operation and second burst data input operation are started.

According to the second example of the fourth embodiment, in the device having a plurality of memory cell arrays, the same effects as those of the first to third embodiments and the first example of the fourth embodiment can be attained even in a case of "the number of bits which can be simultaneously read/written>B.L.×I/O".

In the second to fourth embodiments, the number of I/Os is set to 16, but the number of I/Os is not limited to 16. For example, the number of I/Os can be set to a value which is equal to or larger than 1 and smaller than 16 and can also be set to a value which is equal to or larger than 16. That is, when the number of I/Os is set to "N", N may be set to a natural number equal to or larger than 1.

Further, in the third and fourth embodiments, the number of memory cell arrays 1 and the number of ECC circuits 3 are set to "2", but they are not limited to two. When the numbers of memory cell arrays 1 and ECC circuits are set to "K", K may be a natural number equal to or larger than 2.

The burst length can be set to 2 or more and when the burst length is set to "M", M may be a natural number equal to or larger than 2.

As one example, a device in which "K=4, M=8 and N=32" is set is explained.

In this case, the number of bits which are simultaneously read/written is set to M×N=8×32=256 bits. Since K is 4, each of the ECC circuits 3 is only required to subject (M×N)/K=256/4=64 bits to the ECC operation during the set read latency.

According to a case of the third embodiment, after elapse of the read latency, data of 64 bits×4=256 bits subjected to the ECC operation may be simultaneously transferred from the four ECC circuits 3 to the I/O buffer 2 for every N/K=32/4=8 bits (32 bits in total).

Further, according to the first example of the fourth embodiment, after elapse of the read latency, data of 64 bits×4=256 bits subjected to the ECC operation may be separately transferred from the four ECC circuits 3 to the I/O buffer 2 for every N=32 bits.

When "K=4, M=8+8 and N=32" is set and the number of bits which can be simultaneously read/written is exceeded, the operation may be performed according to the second example of the fourth embodiment. That is, after elapse of the read latency, data of 64 bits×4=256 bits subjected to the ECC operation may be separately transferred from the four ECC circuits 3 to the I/O buffer 2 for every N=32 bits.

After this, the ECC operation for deficient bits of L×N=8×32 bits=256 bits is sequentially performed starting from one of the ECC circuits 3 which has finished the transfer operation and then the bits may be sequentially transferred after transfer of the first 256 bits.

Further, when the number of bits which can be simultaneously read/written becomes larger than the number of deficient bits of L×N like the case of the deficient bits of L×N=4×32 bits=128 bits, for example, the ECC operation for the deficient bits may be performed by use of two ECC circuits 3 among the four ECC circuits 3.

FIFTH EMBODIMENT

One example of an electronic apparatus which utilizes the synchronous semiconductor memory device according to the first to fourth embodiments of this invention is explained as a fifth embodiment of this invention. In this example, a portable telephone terminal is used.

Figure 26:
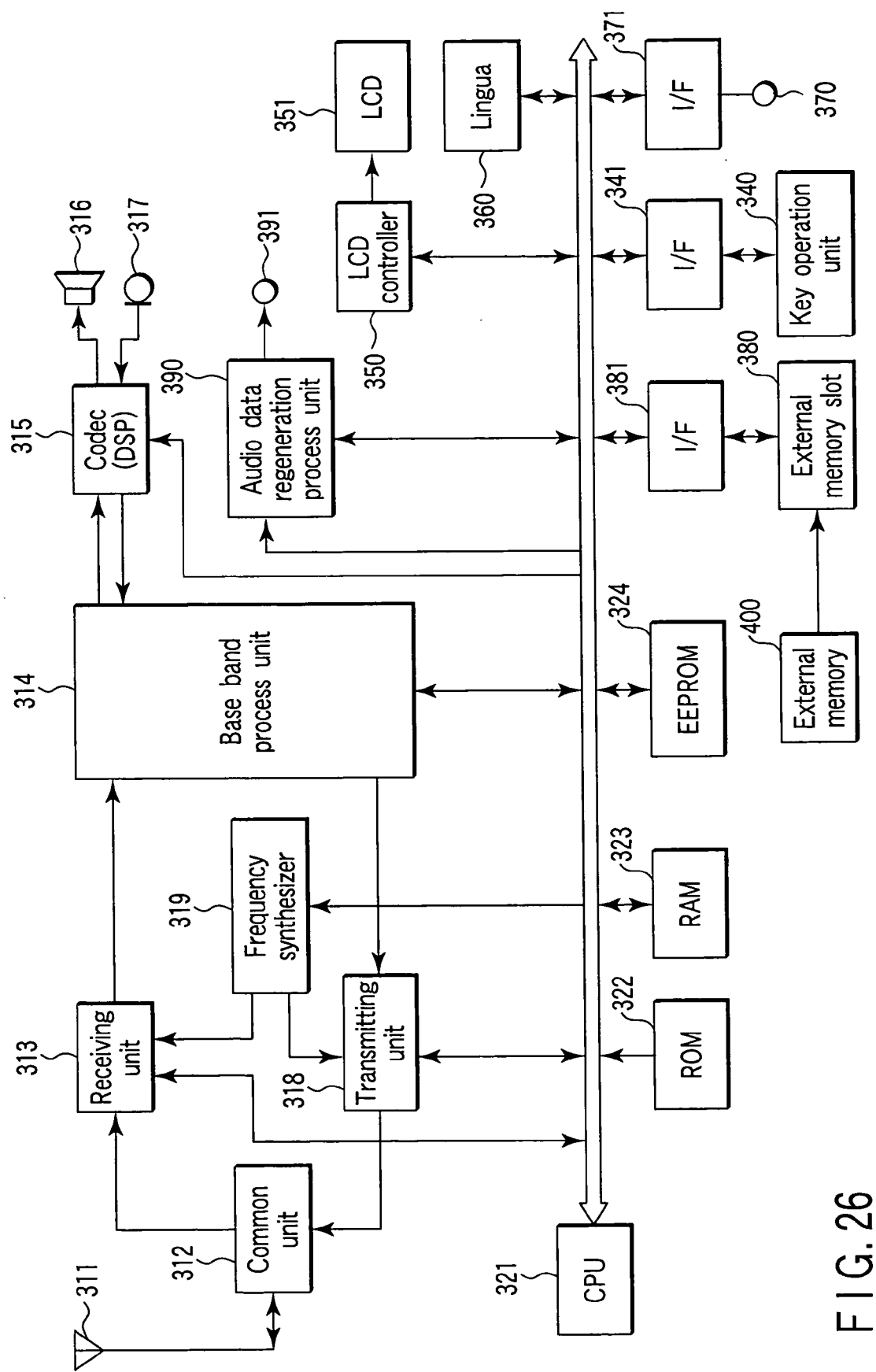
FIG. 26 is a block diagram showing an example of the configuration of the portable telephone terminal.

FIG. 25 is a plan view showing the appearance of a portable telephone terminal and FIG. 26 is a block diagram showing an example of the configuration of the portable telephone terminal.

As shown in FIGS. 25 and 26, the portable telephone terminal includes a communication portion and control portion.

The communication portion includes a transmitting/receiving antenna 311, antenna duplexer 312, receiver 313, base band processor 314, DSP (Digital Signal Processor) 315 used as a voice codec, speaker 316, microphone 317, transmitter 318 and frequency synthesizer 319.

The control portion includes a CPU 321 and a ROM 322, RAM 323 and EEPROM 324 connected to the CPU 321 via a CPU bus 330. The ROM 322 stores a program such as a communication protocol executed in the CPU 321 and necessary data such as display fonts. The RAM 323 is mainly used as a working area and, for example, stores data in the course of calculations during execution of the program by the CPU 321 and temporarily stores data transferred between the control portion and various portions other than the control portion. The EEPROM 324 is a nonvolatile semiconductor memory device and data stored therein is not erased even if the power source of the portable telephone terminal is turned OFF. Therefore, for example, in a case of an application method in which the EEPROM 324 stores set conditions immediately before turn-OFF of the power source and provides the same setting at the next turn-ON time of the power source, it stores the set parameters or the like. Each of the synchronous semiconductor memory devices according to the first to fourth embodiments is used in the above RAM.

The portable telephone terminal according to this example further includes a key operating portion 340, LCD control portion 350, ringer 360, external input/output terminal 370, external memory slot 380 and audio reproducing processor 390.

The key operating portion 340 is connected to a CPU bus 330 via an interface circuit (I/F) 341. Key-in information input by use of the key operating portion 340 is transmitted to the CPU 321, for example.

For example, the LCD control portion 350 receives display information from the CPU 321 via the CPU bus 330, coverts the display information to LCD control information used to control an LCD (liquid crystal display) 351 and transmits the LCD control information to the LCD 351.

The ringer 360 generates a ring tone or the like, for example.

The external input/output terminal 370 is connected to the CPU bus 330 via an interface circuit 371 and functions as a terminal when information is input from the exterior to the portable telephone terminal or information is output from the portable telephone terminal to the exterior.

An external memory 400 such as a memory card is inserted into the external memory slot 380. The external memory slot 380 is connected to the CPU bus 330 via an interface circuit 381. By providing the slot 380 in the portable telephone terminal, it becomes possible to write information from the portable telephone terminal into the external memory 400 or read out information stored in the external memory 400 and input the information into the portable telephone terminal.

The audio reproducing processor 390 reproduces audio information input to the portable telephone terminal or stored in the external memory 400. The reproduced audio information can be extracted to the exterior by transmitting the audio information to a headphone, portable speaker or the like via an external terminal 391, for example. By providing the audio reproducing processor 390 in the portable telephone terminal, for example, audio information can be reproduced.

Thus, the synchronous semiconductor memory devices according to the embodiments of this invention can be applied to an electronic equipment such as a portable telephone.

Particularly, as described in the first embodiment, the synchronous semiconductor memory devices according to the embodiments of this invention are not required to newly perform the ECC operation even when the operation of inputting burst data is interrupted halfway. This is useful for a function of interrupting the data writing operation halfway and preferentially performing the data readout operation. The above function is used to realize the interruption receiving function of the portable telephone, for example.

Therefore, the synchronous semiconductor memory devices according to the embodiments of this invention are suitable for electronic apparatuses such as portable telephones which interrupt the data writing operation halfway and preferentially perform the data read operation.

As described above, this invention has been explained with reference to the embodiments, but this invention is not limited to the above embodiments and can be variously modified without departing from the technical scope thereof when embodying this invention.

Further, the above embodiments can be independently performed, but they can also be adequately combined and performed.

Inventions of various stages are contained in the above embodiments and can be extracted by adequately combining a plurality of constituents disclosed in the above embodiments.

Further, in the above embodiments, a case wherein this invention is applied to the PSRAM is explained, but a semiconductor integrated circuit device such as a processor and system LSI containing the above PSRAM is also contained in the range of this invention. This invention is not limited to the PSRAM and can be applied to a semiconductor memory device other than the PSRAM.

As described above, according to the embodiments of this invention, a semiconductor integrated circuit device and an error checking and correcting method thereof which can suppress both of deterioration of the data holding characteristic caused by power saving and deterioration of the access speed can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
    K memory cell arrays (K is a natural number larger than 1) each having a normal data storing portion which stores data used for normal data writing and normal data readout operations, and a parity data storing portion which stores parity data used for an error checking and correcting operation for readout data read out from the normal data storing portion;

K error checking and correcting circuits, each of which performs an error checking and correcting operation for readout data read out from the normal data storing portion at data readout time during read latency; and an I/O buffer which outputs readout data subjected to the error checking and correcting operation by use of the K error checking and correcting circuits after elapse of the read latency, wherein each of the K error checking and correcting circuits performs an error checking and correcting operation for readout data of (M×N)/K bits (where M is a natural number larger than 1 and N is a natural number larger than 0) read out from the normal data storing portion at burst data read time during the read latency in a case where burst length is set to M and the number of I/Os is set to N, and wherein each of the K error checking and correcting circuits separately transfers data of (M×N)/K bits subjected to the error checking and correcting operation to the I/O buffer for every N bits and one of the error checking and correcting circuits which has finished M/K data transfer operations performs an error checking and correcting operation for readout data of L×N bits (where L is a natural number larger than 0) following on the (M×N)/K bits after elapse of the read latency while a different one of the error checking and correcting circuits is transferring data (where L×N ≦ (M×N)/K) in a case where burst length is set to (M+L).

2. A semiconductor integrated circuit device comprising:

K memory cell arrays (K is a natural number larger than 1) each having a normal data storing portion which stores data used for normal data writing and normal data readout operations, and a parity data storing portion which stores parity data used for an error checking and correcting operation for readout data read out from the normal data storing portion;

K error checking and correcting circuits, each of which performs an error checking and correcting operation for readout data read out from the normal data storing portion at data readout time during read latency; and an I/O buffer which outputs readout data subjected to the error checking and correcting operation by use of the K error checking and correcting circuits after elapse of the read latency, wherein each of the K error checking and correcting circuits performs an error checking and correcting operation for readout data of (M×N)/K bits (where M is a natural number larger than 1 and N is a natural number larger than 0) read out from the normal data storing portion at burst data write time during the read latency in a case where burst length is set to M and the number of I/Os is set to N, and wherein the I/O buffer separately transfers input write data to the K error checking and correcting circuits for every N bits after elapse of the read latency, each of the K error checking and correcting circuits separately rewrites data of (M×N)/K bits subjected to the error checking and correcting operation for every N bits according to transferred write data, and one of the error checking and correcting circuits which has finished the operation of rewriting data of (M×N)/K bits performs an operation of creating check data based on the rewritten data of (M×N)/K bits, writing the thus created check data into the parity data storing portion, writing the rewritten data of (M×N)/K bits into the normal data storing portion, and checking and correcting an error of readout data of L×N bits (where L is a natural number larger than 0 and L×N≦(M×N)/K)) following on the (M×N)/K bits while a different one of the error checking and correcting circuits is rewriting data in a case where burst length is set to (M+L).

* * * * *